US009540728B2

(12) United States Patent
Moriya et al.

(10) Patent No.: US 9,540,728 B2
(45) Date of Patent: Jan. 10, 2017

(54) SUBSTRATE PROCESSING APPARATUS, APPARATUS FOR MANUFACTURING SEMICONDUCTOR DEVICE, AND GAS SUPPLY SYSTEM

(71) Applicant: HITACHI KOKUSAI ELECTRIC INC., Tokyo (JP)

(72) Inventors: Atsushi Moriya, Toyama (JP); Naoharu Nakaiso, Toyama (JP); Yugo Orihashi, Toyama (JP); Kotaro Murakami, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/190,578

(22) Filed: Jun. 23, 2016

(65) Prior Publication Data
US 2016/0305023 A1    Oct. 20, 2016

Related U.S. Application Data

(62) Division of application No. 14/929,973, filed on Nov. 2, 2015, now Pat. No. 9,412,587.

(30) Foreign Application Priority Data

Nov. 19, 2014   (JP) .................................. 2014-234401
Sep. 18, 2015   (JP) .................................. 2015-185891

(51) Int. Cl.
*C23C 16/00*         (2006.01)
*C23C 16/455*        (2006.01)
(Continued)

(52) U.S. Cl.
CPC ......... *C23C 16/45523* (2013.01); *C23C 16/24* (2013.01); *H01L 21/0245* (2013.01);
(Continued)

(58) Field of Classification Search
CPC ....................................................... H01L 21/02
(Continued)

(56) References Cited

U.S. PATENT DOCUMENTS 5,213,991 A     5/1993  Inokawa et al.
5,855,954 A *   1/1999  Gutheit ................. H01L 23/142
                                                 257/E23.006
(Continued)

FOREIGN PATENT DOCUMENTS

JP      62-183508 A     8/1987
JP      04-051565 A     2/1992
(Continued)

OTHER PUBLICATIONS

Japanese Office Action issued on Nov. 1, 2016 in Japanese Application No. 2015-185891.

*Primary Examiner* — Caleb Henry
(74) *Attorney, Agent, or Firm* — Volpe and Koenig, P.C.

(57) ABSTRACT

A method of manufacturing a semiconductor device includes alternately performing supplying a first process gas containing silicon and a halogen element to a substrate having a surface on which monocrystalline silicon and an insulation film are exposed and supplying a second process gas containing silicon and not containing a halogen element to the substrate, and supplying a third process gas containing silicon to the substrate, whereby a first silicon film is homo-epitaxially grown on the monocrystalline silicon and a second silicon film differing in crystal structure from the first silicon film is grown on the insulation film.

20 Claims, 47 Drawing Sheets

(51) Int. Cl.
  *H01L 27/108* (2006.01)
  *H01L 21/02* (2006.01)
  *H01L 27/115* (2006.01)
  *C23C 16/24* (2006.01)

(52) U.S. Cl.
  CPC .... *H01L 21/0262* (2013.01); *H01L 21/02513* (2013.01); *H01L 21/02532* (2013.01); *H01L 21/02592* (2013.01); *H01L 21/02598* (2013.01); *H01L 21/02645* (2013.01); *H01L 27/1085* (2013.01); *H01L 27/10891* (2013.01); *H01L 27/11582* (2013.01)

(58) Field of Classification Search
  USPC .......................................... 438/479; 118/715
  See application file for complete search history.

(56) References Cited

U.S. PATENT DOCUMENTS

| | | | | |
|---|---|---|---|---|
| 5,864,180 | A | 1/1999 | Hori et al. | |
| 5,994,735 | A | 11/1999 | Maeda et al. | |
| 6,143,629 | A * | 11/2000 | Sato | H01L 21/76262 257/758 |
| 6,165,874 | A * | 12/2000 | Powell | C30B 25/02 257/E21.125 |
| 6,306,729 | B1 * | 10/2001 | Sakaguchi | H01L 21/76259 257/E21.122 |
| 6,900,115 | B2 * | 5/2005 | Todd | B82Y 10/00 257/E21.101 |
| 7,186,630 | B2 * | 3/2007 | Todd | H01L 21/0262 257/E21.101 |
| 7,465,953 | B1 * | 12/2008 | Koh | B82Y 10/00 257/213 |
| 7,772,097 | B2 * | 8/2010 | Tomasini | C23C 16/04 118/720 |
| 7,863,163 | B2 * | 1/2011 | Bauer | C30B 25/02 257/E21.102 |
| 7,897,495 | B2 * | 3/2011 | Ye | H01L 21/02529 257/E21.042 |
| 8,278,176 | B2 * | 10/2012 | Bauer | H01L 21/02529 438/300 |
| 8,486,191 | B2 * | 7/2013 | Aggarwal | C23C 16/04 118/715 |
| 8,921,205 | B2 * | 12/2014 | Todd | H01L 21/0262 438/478 |
| 2002/0168868 | A1 * | 11/2002 | Todd | B82Y 10/00 438/767 |
| 2003/0021895 | A1 * | 1/2003 | Ramm | C23C 16/45525 427/255.26 |
| 2006/0115933 | A1 * | 6/2006 | Ye | H01L 21/02381 438/139 |
| 2006/0166414 | A1 * | 7/2006 | Carlson | H01L 21/02381 438/149 |
| 2007/0287272 | A1 * | 12/2007 | Bauer | H01L 21/02529 438/485 |
| 2008/0026149 | A1 * | 1/2008 | Tomasini | C23C 16/04 427/255.28 |
| 2008/0157092 | A1 | 7/2008 | Arai et al. | |
| 2010/0255658 | A1 * | 10/2010 | Aggarwal | C23C 16/04 438/478 |
| 2012/0012047 | A1 * | 1/2012 | Lu | C30B 25/16 117/85 |
| 2015/0126021 | A1 | 5/2015 | Koshi et al. | |
| 2015/0140795 | A1 * | 5/2015 | Theis | H01L 21/02529 438/488 |

FOREIGN PATENT DOCUMENTS

| | | |
|---|---|---|
| JP | 7-099311 A | 4/1995 |
| JP | 08-204032 A | 8/1996 |
| JP | 10-242049 A | 9/1998 |
| JP | 2007-317874 A | 12/2007 |
| JP | 2008-159804 A | 7/2008 |
| JP | 2013-197307 A | 9/2013 |
| JP | 2014-067796 A | 4/2014 |
| WO | 2012/029661 A1 | 3/2012 |

* cited by examiner

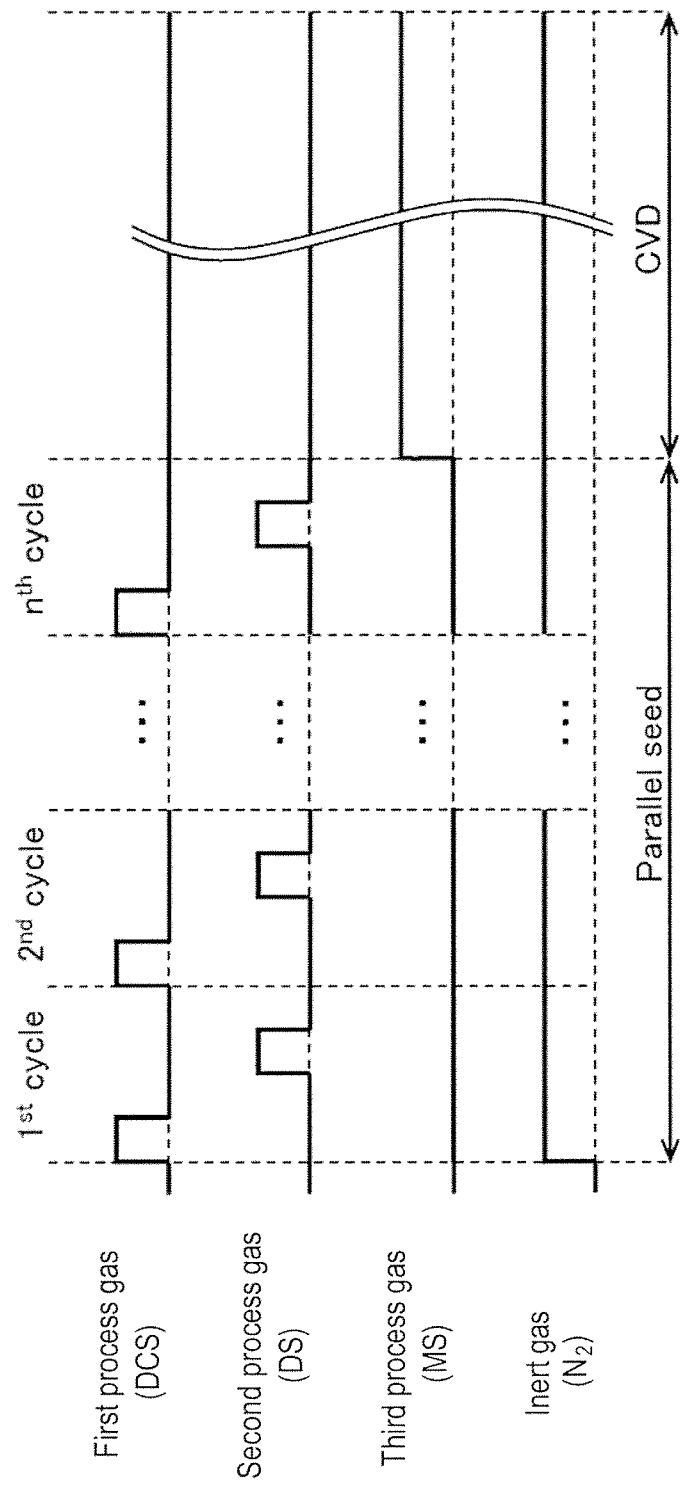

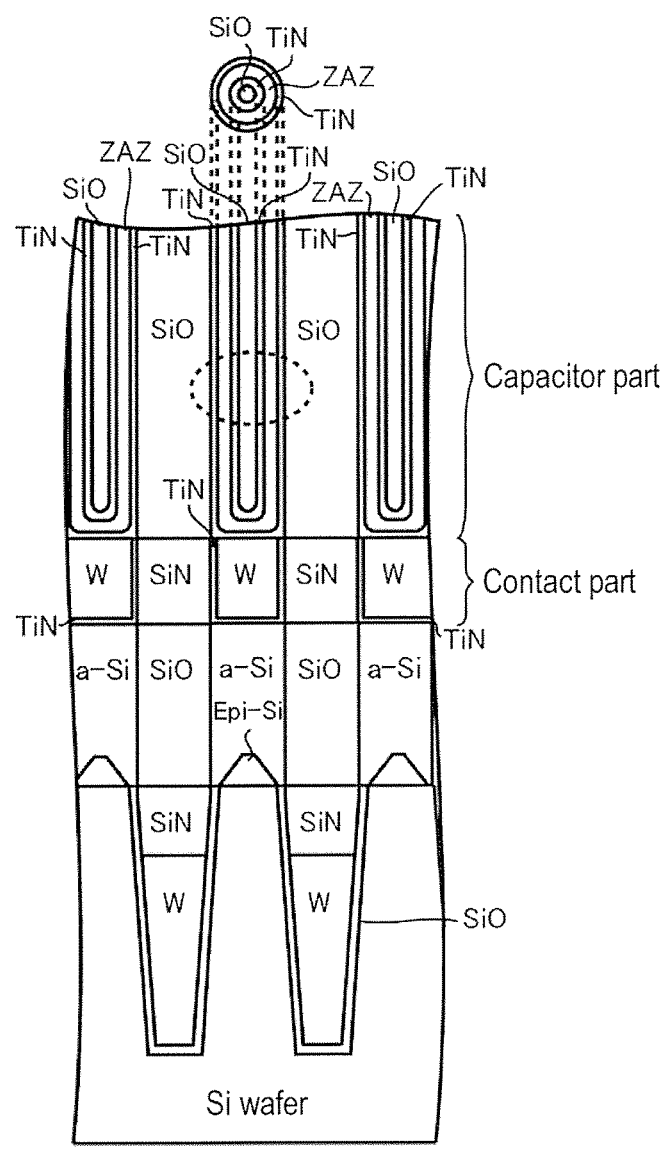

_US 9,540,728 B2_

SUBSTRATE PROCESSING APPARATUS, APPARATUS FOR MANUFACTURING SEMICONDUCTOR DEVICE, AND GAS SUPPLY SYSTEM

CROSS-REFERENCE TO RELATED APPLICATION

This application is based upon and claims the benefit of priority from Japanese Patent Application No. 2014-234401, filed on Nov. 19, 2014, and Japanese Patent Application No. 2015-185891, filed on Sep. 18, 2015, the entire contents of which are incorporated herein by reference.

TECHNICAL FIELD

The present disclosure relates to a method of manufacturing a semiconductor device, a substrate processing apparatus, a gas supply system, and a recording medium.

BACKGROUND

As an example of processes of manufacturing a semiconductor device, a film forming process of forming a silicon film (Si film) on a substrate having an insulation film exposed in at least a portion of a surface thereof is often carried out.

SUMMARY

The present disclosure provides some embodiments of a technique capable of improving the quality of a Si film when forming the Si film on a substrate having an insulation film exposed in at least a portion of a surface thereof.

According to an aspect of the present disclosure, provided is a technology including alternately performing supplying a first process gas containing silicon and a halogen element to a substrate having a surface on which monocrystalline silicon and an insulation film are exposed and supplying a second process gas containing silicon and not containing a halogen element to the substrate, and supplying a third process gas containing silicon to the substrate, whereby a first silicon film is homo-epitaxially grown on the monocrystalline silicon and a second silicon film differing in crystal structure from the first silicon film is grown on the insulation film.

BRIEF DESCRIPTION OF THE DRAWINGS

FIG. 4 is a view illustrating gas supply timings in a film forming sequence according to one embodiment of the present disclosure.

FIGS. 16A to 16G are views illustrating manufacturing processes of DRAM, respectively.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
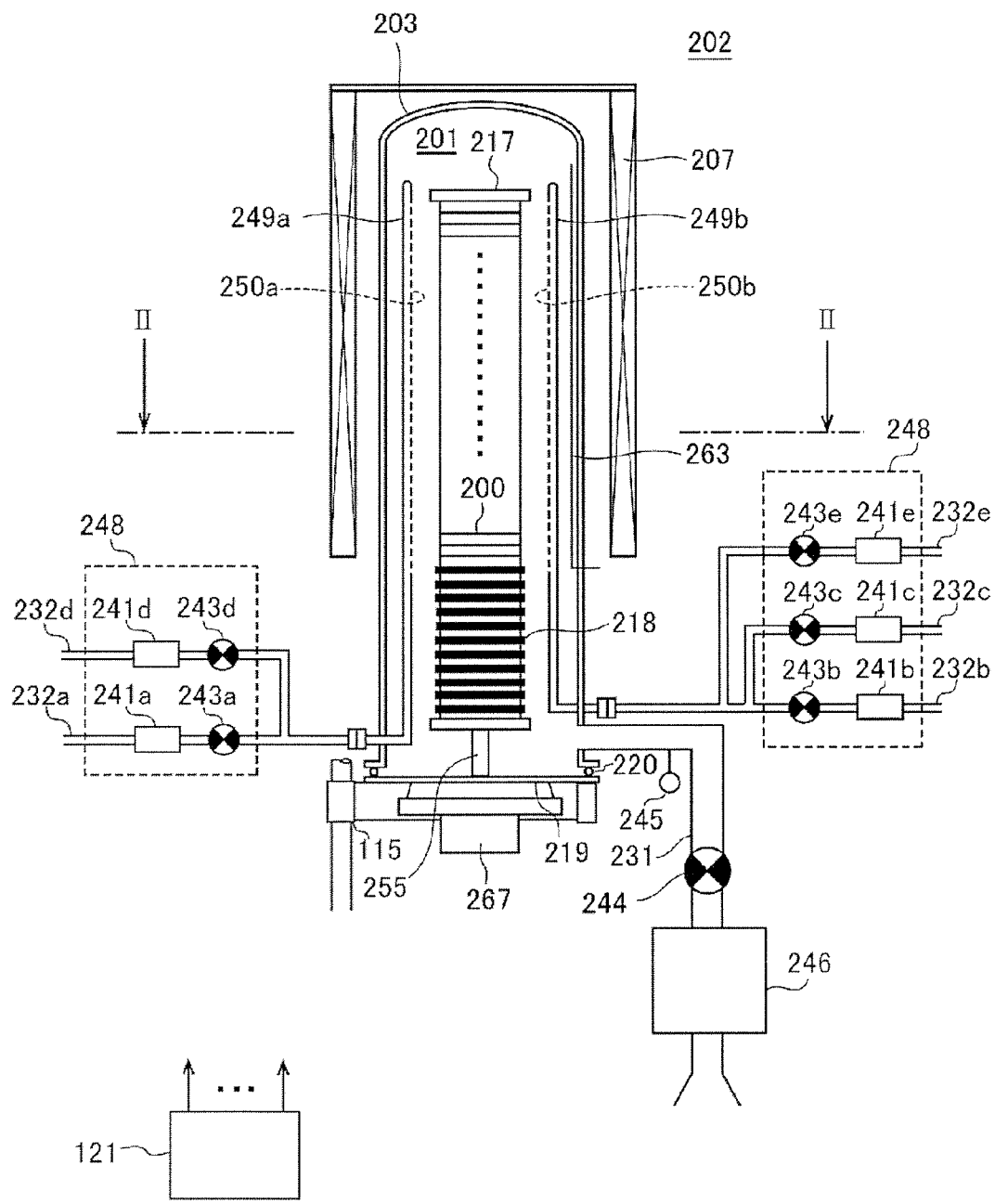
FIG. 1 is a schematic configuration view of a vertical processing furnace of a substrate processing apparatus suitably used in one embodiment of the present disclosure, in which a portion of the processing furnace is shown in a vertical cross section.
Figure 2:
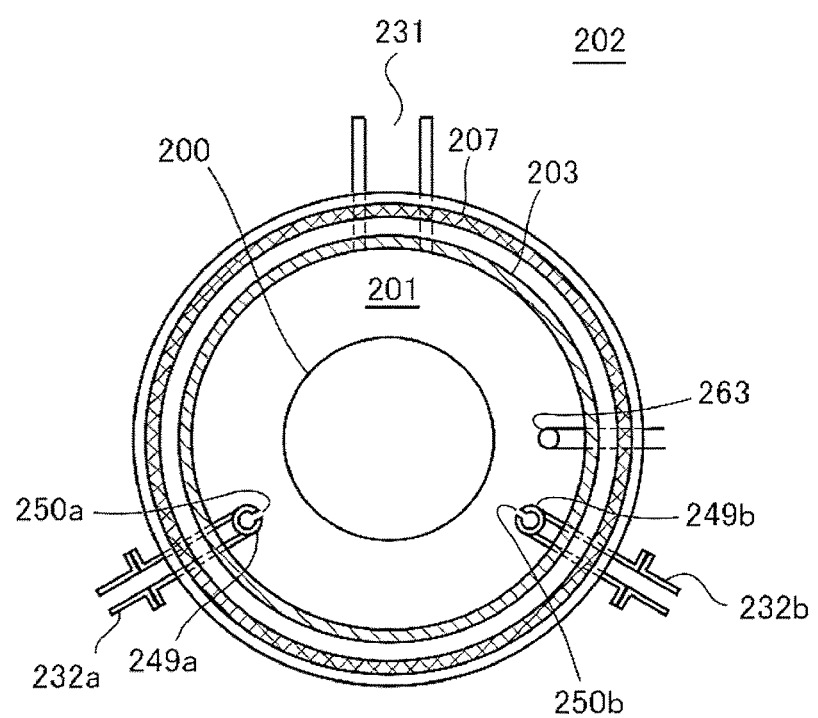
FIG. 2 is a schematic configuration view of the vertical processing furnace of the substrate processing apparatus suitably used in one embodiment of the present disclosure, in which a portion of the processing furnace is shown in a cross section taken along line II-II in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed in the process chamber 201 to penetrate through a lower sidewall of the reaction tube 203. The nozzles 249a and 249b are made of, e.g., a heat resistant material such as quartz, SiC or the like. Gas supply pipes 232a and 232b are respectively connected to the nozzles 249a and 249b. A gas supply pipe 232c is connected to the gas supply pipe 232b. In this way, the two nozzles 249a and 249b and the three gas supply pipes 232a to 232c are installed in the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241c, which are flow rate controllers (flow rate control parts), and valves 243a to 243c, which are opening/closing valves, are sequentially installed in the gas supply pipes 232a to 232c from the corresponding upstream sides. Gas supply pipes 232d and 232e, which supply an inert gas, are respectively connected to the gas supply pipes 232a and 232b at the downstream side of the valves 243a and 243b. MFCs 241d and 241e, which are flow rate controllers (flow rate control parts), and valves 243d and 243e, which are opening/closing valves, are sequentially installed in the gas supply pipes 232d and 232e from the corresponding upstream sides.

The nozzles 249a and 249b are respectively connected to end portions of the gas supply pipes 232a and 232b. As shown in FIG. 2, the nozzles 249a and 249b are disposed in an annular space, when seen in a plane view, between the inner wall of the reaction tube 203 and the wafers 200 such that the nozzles 249a and 249b extend upward along an arrangement direction of the wafers 200 from a lower portion of the inner wall of the reaction tube 203 to an upper portion thereof. Specifically, the nozzles 249a and 249b are installed along a wafer arrangement region in which the wafers 200 are arranged, in a region that horizontally surrounds the wafer arrangement region at a side of the wafer arrangement region. That is to say, the nozzles 249a and 249b are respectively installed in a perpendicular relationship with the surfaces (flat surfaces) of the wafers 200 at a lateral side of the end portions (peripheral edge portions) of the wafers 200 carried into the process chamber 201. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on the side surfaces of the nozzles 249a and 249b. Each of the gas supply holes 250a and 250b is opened toward the center of the reaction tube 203 to allow the gas to be supplied toward the wafers 200. The gas supply holes 250a and 250b may be formed in a plural number so as to span from the lower portion of the reaction tube 203 to the upper portion thereof. The respective gas supply holes 250a and 250b may have the same opening area. Further, the gas supply holes 250a and 250b may be formed at a predetermined opening pitch.

As described above, in the present embodiment, a gas is transferred through the nozzles 249a and 249b, which are disposed in the vertically-elongated annular space when seen in a plane view, i.e., a cylindrical space, defined by the inner surface of the side wall of the reaction tube 203 and the end portions (peripheral edge portions) of the wafers 200 arranged within the reaction tube 203. The gas is initially injected into the reaction tube 203, near the wafers 200, through the gas supply holes 250a and 250b formed in the nozzles 249a and 249b. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A first process gas, for example, a gas containing silicon (Si) and a halogen element, namely a halosilane precursor gas, is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under a room temperature and an atmospheric pressure, or a halosilane precursor which remains in a gas state under a room temperature and an atmospheric pressure. The halosilane precursor refers to a silane precursor having a halogen group. Examples of the halogen group may include a chloro group, a fluoro group, a bromo group and an iodine group.

That is to say, the halogen group includes a halogen element such as chlorine (Cl), fluorine (F), bromine (Br), iodine (I) or the like. The halosilane precursor may be said to be one kind of halide. When the term "precursor" is used herein, it may refer to "a precursor staying in a liquid state," "a precursor (precursor gas) staying in a gaseous state," or both.

As the first process gas, it may be possible to use, e.g., a halosilane precursor gas containing Si and Cl, namely a chlorosilane precursor gas containing silane chloride (a chlorine compound of silicon). As the chlorosilane precursor gas, it may be possible to use, e.g., a dichlorosilane ($SiH_2Cl_2$, abbreviation: DCS) gas containing one Si atom, two Cl atoms and two hydrogen (H) atoms in one molecule (in one molecular structure).

A dopant gas, namely a gas containing an impurity (a dopant) to be added to a finally-formed Si film, is supplied from the gas supply pipe $232a$ into the process chamber $201$ via the MFC $241a$, the valve $243a$ and the nozzle $249a$. As the dopant gas, it may be possible to use a gas containing one of a Group III element and a Group V element, for example, a phosphine ($PH_3$, abbreviation: PH) gas containing one phosphorus (P) atom and three H atoms in one molecule.

A second process gas, for example, a silane precursor gas containing Si and not containing a halogen element, is supplied from the gas supply pipe $232b$ into the process chamber $201$ via the MFC $241b$, the valve $243b$ and the nozzle $249b$. As the second process gas, it may be possible to use a hydrogenated silane precursor gas containing hydrogenated silane (hydrogenated silicon), i.e., a hydrogen compound of silicon, for example, a disilane ($Si_2H_6$, abbreviation: DS) containing two Si atoms and six H atoms in one molecule and not containing a halogen element.

A third process gas, for example, a silane precursor gas containing Si, is supplied from the gas supply pipe $232c$ into the process chamber $201$ via the MFC $241c$, the valve $243c$, the gas supply pipe $232b$ and the nozzle $249b$. As the third process gas, it may be possible to use a hydrogenated silane precursor gas containing hydrogenated silane (hydrogenated silicon), i.e., a hydrogen compound of silicon, for example, a monosilane ($SiH_4$, abbreviation: MS) containing one Si atom and four H atoms in one molecule and not containing a halogen element.

An inert gas, for example, a nitrogen ($N_2$) gas, is supplied from the gas supply pipes $232d$ and $232e$ into the process chamber $201$ via the MFCs $241d$ and $241e$, the valves $243d$ and $243e$, the gas supply pipes $232a$ and $232b$, and the nozzles $249a$ and $249b$.

In the case of supplying the first process gas from the gas supply pipe $232a$, a first process gas supply system is mainly configured by the gas supply pipe $232a$, the MFC $241a$ and the valve $243a$. The nozzle $249a$ may be included in the first process gas supply system. The first process gas supply system may be referred to as a first precursor gas supply system or a first precursor supply system. In the case of supplying the halosilane precursor gas from the gas supply pipe $232a$, the first process gas supply system may be referred to as a halosilane precursor gas supply system or a halosilane precursor supply system.

In the case of supplying the dopant gas from the gas supply pipe $232a$, a dopant gas supply system is mainly configured by the gas supply pipe $232a$, the MFC $241a$ and the valve $243a$. The nozzle $249a$ may be included in the dopant gas supply system. The dopant gas supply system may be referred to as a dopant supply system.

In the case of supplying the second process gas from the gas supply pipe $232b$, a second process gas supply system is mainly configured by the gas supply pipe $232b$, the MFC $241b$ and the valve $243b$. The nozzle $249b$ may be included in the second process gas supply system. The second process gas supply system may be referred to as a second precursor gas supply system or a second precursor supply system. In the case of supplying the hydrogenated silane precursor gas from the gas supply pipe $232b$, the second process gas supply system may be referred to as a hydrogenated silane precursor gas supply system or a hydrogenated silane precursor supply system.

In the case of supplying the third process gas from the gas supply pipe $232c$, a third process gas supply system is mainly configured by the gas supply pipe $232c$, the MFC $241c$ and the valve $243c$. The nozzle $249b$ at the downstream side of a connection portion, at which the gas supply pipe $232b$ is connected to the gas supply pipe $232c$, may be included in the third process gas supply system. The third process gas supply system may be referred to as a third precursor gas supply system or a third precursor supply system. In the case of supplying the hydrogenated silane precursor gas from the gas supply pipe $232c$, the third process gas supply system may be referred to as a hydrogenated silane precursor gas supply system or a hydrogenated silane precursor supply system.

One or all of the first process gas supply system, the second process gas supply system and the third process gas supply system may be referred to as a process gas supply system or a film forming gas supply system. The dopant gas supply system may be included in the film forming gas supply system (the process gas supply system).

An inert gas supply system is mainly configured by the gas supply pipes $232d$ and $232e$, the MFCs $241d$ and $241e$, and the valves $243d$ and $243e$. The inert gas supply system may be referred to as a purge gas supply system, a dilution gas supply system or a carrier gas supply system.

One or all of the various gas supply systems described above may be configured as an integrated gas supply system $248$ in which the valves $243a$ to $243e$, the MFCs $241a$ to $241e$, and the like are integrated. The integrated gas supply system $248$ is configured to be controlled by a controller $121$ described later, which is connected to the respective gas supply pipes $232a$ to $232e$ to control the supplying operation of various kinds of gases into the gas supply pipes $232a$ to $232e$, i.e., the opening/closing operation of the valves $243a$ to $243e$ or the flow rate adjusting operation by the MFCs $241a$ to $241e$. The integrated gas supply system $248$ is formed in an integral type or split type integrated units, so that attachment/detachment for the gas supply pipes $232a$ to $232e$ or the like can be performed using the integrated unit as a unit and maintenance, replacement, extension or the like, of the gas supply system can be conducted using the integrated unit as a unit. The various gas supply systems described above may be referred to as a gas supply unit, a gas supply system, and a gas supply part, respectively.

An exhaust pipe $231$ for exhausting an internal atmosphere of the process chamber $201$ is installed in the reaction tube $203$. A vacuum exhaust device, e.g., a vacuum pump $246$, is connected to the exhaust pipe $231$ via a pressure sensor $245$, which is a pressure detector (pressure detecting part) for detecting an internal pressure of the process chamber $201$, and an Auto Pressure Controller (APC) valve $244$, which is a pressure regulator (pressure regulating part). The APC valve $244$ is configured to perform or stop vacuum exhaust in the process chamber $201$ by opening or closing the valve while actuating the vacuum pump $246$ and is also configured to regulate the internal pressure of the process chamber $201$ by adjusting an opening degree of the valve pursuant to pressure information detected by the pressure sensor 245 while actuating the vacuum pump 246. An exhaust system is mainly configured by the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired or specified temperature distribution. Similar to the nozzles 249a and 249b, the temperature sensor 263 is formed in an L-shape. The temperature sensor 263 is installed along the inner wall of the reaction tube 203.

Figure 3:
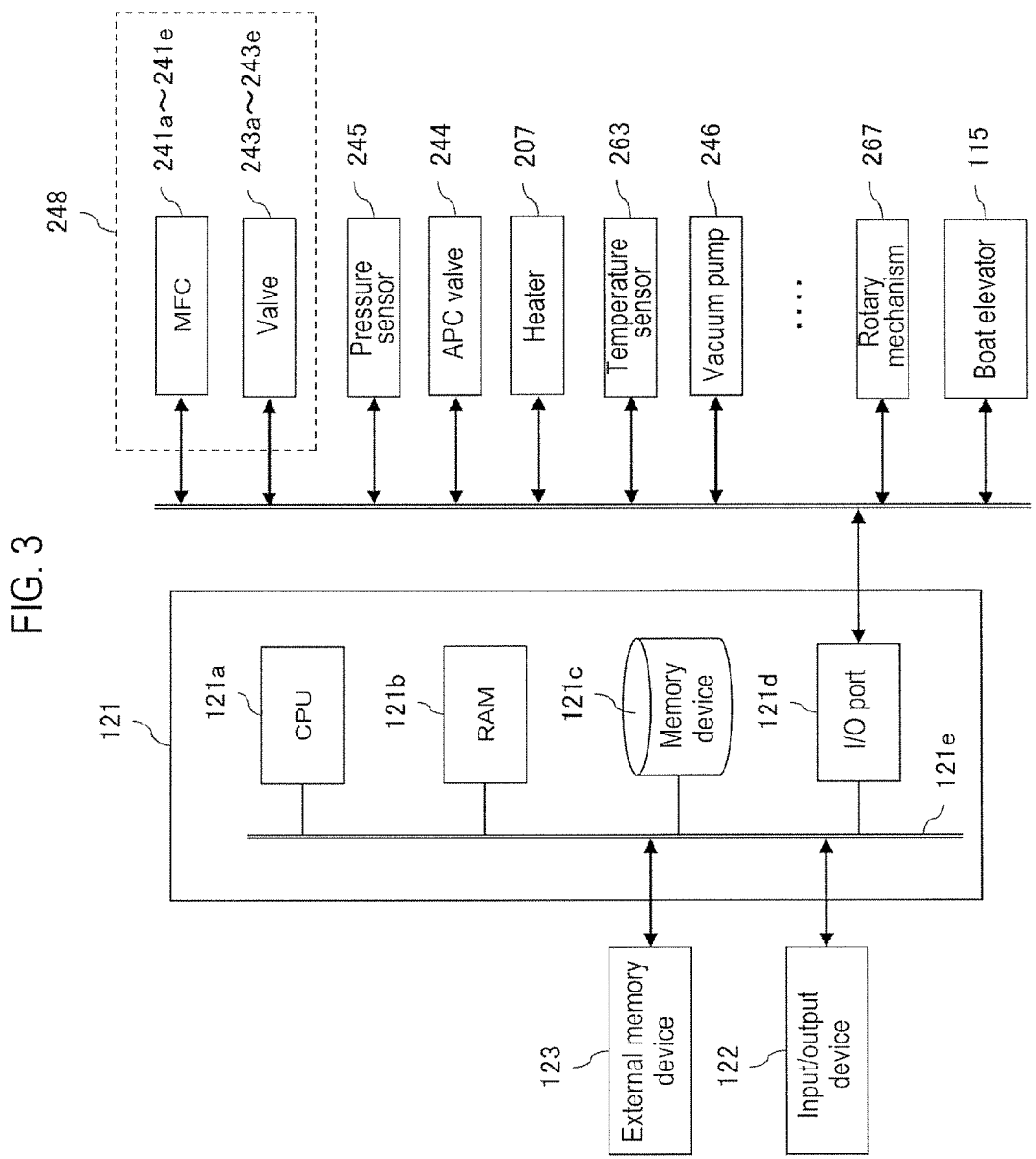
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Further, the process recipe may be simply referred to as "a recipe." Also, when the term "program" is used herein, it may indicate a case of including only a recipe, a case of including only a control program, or a case of including both a recipe and a control program. In addition, the RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjusting operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the operation of rotating the boat 217 with the rotary mechanism 267 and adjusting the rotation speed of the boat 217, the operation of moving the boat 217 up and down with the boat elevator 115, and the like, according to contents of the read recipe.

Moreover, the controller 121 may be configured by installing the above-described program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card) on the computer. The memory device 121c or the external memory device 123 is configured as a non-transitory computer-readable recording medium. Hereinafter, these will be simply collectively referred to as "a recording medium." In addition, when the term "recording medium" is used in the subject specification, it may indicate a case of including only the memory device 121c, a case of including only the external memory device 123, or a case of including both the memory device 121c and the external memory device 123. The program may be supplied to the computer using communication means such as the Internet or a dedicated line, rather than through the external memory device.

(2) Substrate Processing Process

An example of a sequence for forming a Si film on a substrate and thermally treating the Si film, which is one of the procedures for manufacturing a semiconductor device, by using the above-described substrate processing apparatus, will be described below with reference to FIGS. 4 and 5A to 5G. In the following descriptions, the operations of the respective units or parts constituting the substrate processing apparatus are controlled by the controller 121.

In a film forming sequence illustrated in FIG. 4, a first Si film 200e is caused to homo-epitaxially grow on monocrystalline Si and a second Si film 200g differing in crystal structure from the first Si film 200e is caused to grow on an insulation film 200a, by performing:

a step (parallel seed step) of alternately performing Step 1 of supplying a DCS gas as a first process gas to a wafer 200 as a substrate having a surface on which the monocrystalline Si and the insulation film 200a are exposed and Step 2 of supplying a DS gas as a second process gas to the wafer 200; and a step (CVD film forming step) of supplying an MS gas as a third process gas to the wafer 200.

That is to say, in a film forming sequence illustrated in FIG. 4, a laminated structure (laminated film) including the first Si film 200e and the second Si film 200g formed on the first Si film 200e is formed on the monocrystalline Si by using three kinds of silane precursor gases (triple Si sources). In the following descriptions, the laminated film may be simply referred to as a Si film.

Thereafter, a step (annealing step) of making a portion of the second Si film 200g which makes contact with the first Si film 200e (a homo-epitaxial Si film) homo-epitaxial is performed by thermally treating (annealing) the Si film including the first Si film 200e and the second Si film 200g formed on the first Si film 200e.

In the subject specification, for the sake of convenience, the film forming sequence described above may be denoted as follows. Furthermore, the annealing is often referred to as ANL.

$$[(DCS \rightarrow DS) \times n \rightarrow MS] \rightarrow ANL \Rightarrow Si$$

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body."

As such, as used herein, the sentence "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the sentence "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer."

(Wafer Charging and Boat Loading)

A plurality of wafers 200 is charged on the boat 217 (wafer charging). Thereafter, as illustrated in FIG. 1, the boat 217 charged with the plurality of wafers 200 is lifted up by the boat elevator 115 and is loaded into the process chamber 201 (boat loading). In this state, the seal cap 219 seals the lower end of the reaction tube 203 through the O-ring 220.

As the wafer 200, it may be possible to use, e.g., a Si substrate composed of monocrystalline Si or a substrate having a surface on which a monocrystalline Si film is formed. As illustrated as a partially-enlarged view in FIG. 12A, an insulation film 200a, e.g., a silicon oxide film ($SiO_2$ film) (hereinafter also referred to as a SiO film), is formed in advance in a portion of the surface of the wafer 200. That is to say, the surface of the wafer 200 stays in such a state that the monocrystalline Si and the insulation film 200a are exposed. The insulation film 200a may be, in addition to the SiO film, a Si-based insulation film such as a silicon nitride film (SiN film), a silicon carbide film (SiC film), a silicon carbonitride film (SiCN film), a silicon oxynitride film (SiON film), a silicon oxycarbide film (SiOC film), a silicon oxycarbonitride film (SiOCN film), a silicon boronitride film (SiBN film), a silicon borocarbonitride film (SiBCN film) or the like, or a metal-based insulation film such as an aluminum oxide film (AlO film), a hafnium oxide film (HfO film), a zirconium oxide film (ZrO film), a titanium oxide film (TiO film) or the like. That is to say, the insulation film 200a may be a high-k film (high-permittivity insulating film) such as an HfO film, a ZrO film or the like, or may be a low-k film (low-permittivity insulating film) such as an SiOCN film, an SiOC film, an SiBN film, an SiBCN film or the like.

Figure 5A:
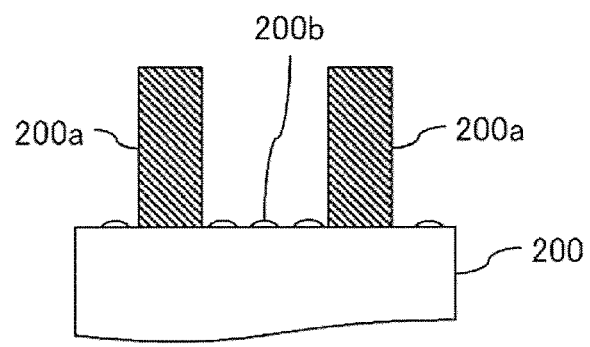
FIG. 5A is a view illustrating a surface structure of a wafer prior to the start of a parallel seed step.
Figure 12A:
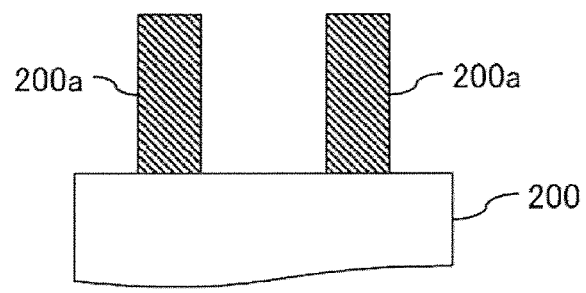
FIG. 12A is a view illustrating surface structure example 1 of a wafer to be processed.

FIGS. 5A to 5G illustrate a case where a wafer 200 having a surface structure illustrated in FIG. 12A is processed, namely a case where a wafer 200 having a recess formed on the surface thereof with a bottom portion of the recess composed of monocrystalline Si and a side portion and a top portion of the recess composed of an insulation film (SiO film) 200a is processed. For the sake of convenience, FIGS. 5A to 5G illustrate the surface of the wafer 200 in partially-enlarged views. Prior to carrying the wafer 200 into the process chamber 201, the surface of the wafer 200 is cleaned in advance by hydrogen fluoride (HF) or the like. However, the surface of the wafer 200 is temporarily exposed to the atmosphere until the wafer 200 is carried into the process chamber 201 after the cleaning. For that reason, as illustrated in FIG. 5A, a natural oxide film (SiO film) 200b is formed in at least a portion of the surface of the wafer 200 carried into the process chamber 201. The natural oxide film 200b may be formed so as to sparsely (in an island shape) cover the bottom portion of the recess, namely a portion of the exposed monocrystalline Si, or may be formed so as to continuously (in a non-island shape) cover the entire region of the exposed monocrystalline Si.

(Pressure Regulation and Temperature Adjustment)

The interior of the process chamber 201, namely the space in which the wafers 200 exist is vacuum-exhausted (pressure-reducingly exhausted) by the vacuum pump 246 so as to have a desired or specified pressure (desired or specified vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired or specified temperature. In this operation, the state of supplying electric power to the heater 207 is feedback-controlled based on the temperature information detected by the temperature sensor 263 such that the interior of the process chamber 201 reaches a desired or specified temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(Parallel Seed Step)

Next, the following two steps, i.e., Steps 1 and 2, are sequentially performed.

[Step 1]

(DCS Gas Supply)

At this step, a DCS gas is supplied to the wafer 200 existing within the process chamber 201.

The valve 243a is opened to flow a DCS gas through the gas supply pipe 232a. The DCS gas is flow rate-adjusted by the MFC 241a. The DCS gas is supplied into the process chamber 201 via the nozzle 249a and is exhausted from the exhaust pipe 231. At this time, the DCS gas is supplied to the wafer 200. At the same time, the valve 243d is opened to flow a $N_2$ gas through the gas supply pipe 232d. The $N_2$ gas is flow rate-adjusted by the MFC 241d. The flow rate-adjusted $N_2$ gas is supplied into the process chamber 201 together with the DCS gas and is exhausted from the exhaust pipe 231. In order to prevent the DCS gas from infiltrating into the nozzle 249b, the valve 243e is opened to flow the $N_2$ gas through the gas supply pipe 232e. The $N_2$ gas is supplied into the process chamber 201 through the gas supply pipe 232b and the nozzle 249b and is exhausted from the exhaust pipe 231.

Figure 5B:
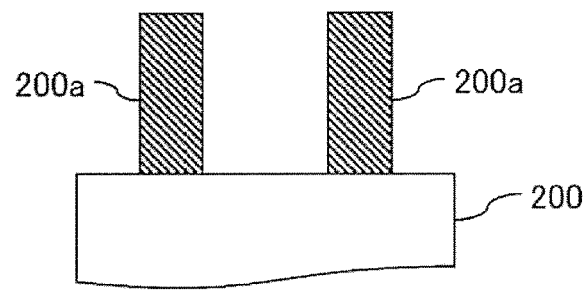
FIG. 5B is a view illustrating a surface structure of a wafer during the progress of a parallel seed step and after the supply of a DCS gas.

By supplying the DCS gas to the wafer 200, it is possible to perform the following processes and to change the surface state of the wafer 200 to the state illustrated in FIG. 5B.

First, in the bottom portion of the recess, namely on the monocrystalline Si, due to the supply of DCS which contains halogen (Cl) exhibiting large electronegativity, oxygen (O) of the natural oxide film 200b formed on the surface of the monocrystalline Si and Cl of DCS pull against each other. It is therefore possible to break Si—O bonds contained in the natural oxide film 200b. Thus, the bonds of Si existing on the surface of the monocrystalline Si become free. That is to say, it is possible to generate dangling bonds of covalent bonds of Si on the surface of the monocrystalline Si. This provides an environment in which the later-described homo-epitaxial growth easily goes ahead. In the bottom portion of the recess, due to the generation of the aforementioned reaction, the natural oxide film 200b formed on the surface of the monocrystalline Si is removed. That is to say, the DCS gas acts as a cleaning gas which removes the natural oxide film 200b from the surface of the monocrystalline Si.

In the side portion and the top portion of the recess, namely on the insulation film (SiO film) 200a, due to the supply of DCS which contains halogen (Cl) exhibiting large electronegativity, O of the surface of the insulation film 200a and Cl of DCS pull against each other. It is therefore possible to break Si—O bonds contained in the insulation film 200a. This makes it possible to form dangling bonds of Si, i.e., Si adsorption sites, on the surface of the insulation film 200a. Essentially, dangling bonds of Si do not exist on the insulation film 200a such as a SiO film or the like. Even if dangling bonds of Si exist, the number of dangling bonds is not so large. For that reason, even if Step 2 of supplying a DS gas to the wafer 200 is performed in this state, Si nuclei do not grow on the surface of the insulation film 200a. Even if Si nuclei grow, the growth of the Si nuclei occurs randomly (in an island shape).

(Residual Gas Removal)

If there is provided an environment in which homo-epitaxial growth easily occur in the bottom portion of the recess and if Si adsorption sites are formed in the side portion and the top portion of the recess, the valve 243a is closed to stop the supply of the DCS gas. At this time, the APC valve 244 is kept opened and the interior of the process chamber 201 is evacuated by the vacuum pump 246. The gas remaining within the process chamber 201, which has not reacted or which has contributed to the aforementioned reaction, is removed from the interior of the process chamber 201. At this time, the valves 243d and 243e are kept opened to continuously supply the $N_2$ gas into the process chamber 201. The $N_2$ gas acts as a purge gas. This makes it possible to effectively remove the gas remaining within the process chamber 201 from the interior of the process chamber 201.

In this case, the gas remaining within the process chamber 201 may not be completely removed and the interior of the process chamber 201 may not be completely purged. If the amount of the gas remaining within the process chamber 201 is small, an adverse effect may not be generated at Step 2 which will be subsequently performed. The flow rate of the $N_2$ gas supplied into the process chamber 201 need not be made large. For example, an amount of the $N_2$ gas to be supplied into the process chamber 201 may be set substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

[Step 2]

(DS Gas Supply)

After Step 1 is completed, a DS gas is supplied to the wafer 200 existing within the process chamber 201.

At this step, the opening/closing control of the valves 243b, 243d and 243e is performed in a procedure similar to the procedure of the opening/closing control of the valve 243a, 243d and 243e at Step 1. The DS gas flowing through the gas supply pipe 232b is flow-rate-adjusted by the MFC 241b. The DS gas is supplied into the process chamber 201 through the nozzle 249b and is exhausted from the exhaust pipe 231. At this time, the DS gas is supplied to the wafer 200.

Figure 5C:
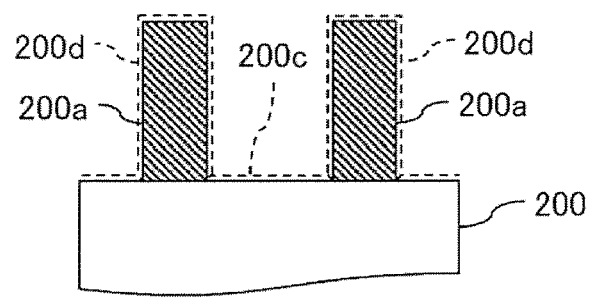
FIG. 5C is a view illustrating a surface structure of a wafer during the progress of a parallel seed step and after the supply of a DS gas.
Figure 5D:
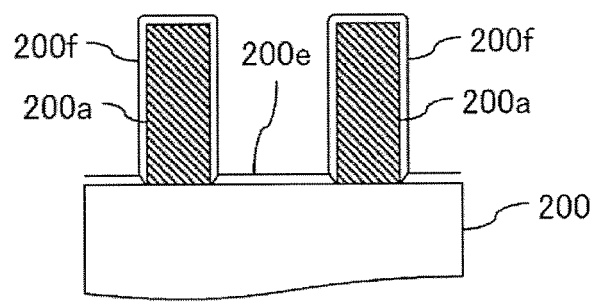
FIG. 5D is a view illustrating a surface structure of a wafer after the completion of a parallel seed step.

By supplying the DS gas to the wafer 200, it is possible to perform the following processes and to change the surface state of the wafer 200 to the state illustrated in FIG. 5C, namely the state in which two kinds of seeds are formed in parallel.

First, in the bottom portion of the recess, namely on the monocrystalline Si, Si contained in DS is bonded to dangling bonds of Si formed by performing Step 1. This enables Si crystals to grow epitaxially (in gas phase epitaxy) on the monocrystalline Si. Since the crystals serving as a base and the crystals grown on these crystals are made of the same material (Si), the growth becomes homo-epitaxial growth. In the homo-epitaxial growth, on the crystals serving as a base, crystals having the same lattice constant as that of the crystals serving as a base and made of the same material as the crystals serving as a base grow in the same crystal orientation. For that reason, in the homo-epitaxial growth, it is possible to obtain less-defective high-quality crystals as compared with hetero-epitaxial growth in which the crystals serving as a base and the crystals grown on these crystals are made of mutually-different materials. The nucleus (or the film) formed at this time may be regarded as a seed (a first seed) 200c of a first Si film (an epitaxial Si film) 200e which will be described later.

In the side portion and the top portion of the recess, namely on the insulation film 200a, it is possible to allow Si contained DS to be adsorbed to the adsorption sites formed by performing Step 1. The crystal structure of the nucleus formed as a result of adsorption of Si to the adsorption sites becomes an amorphous, a poly (polycrystal) or a mixture of the amorphous and the poly. The nucleus formed at this time may be regarded as a seed (a second seed) 200d of a second Si film 200g which will be described later.

(Residual Gas Removal)

If the formation of the first seed 200c and the second seed 200d, namely, the formation of the two kinds of seeds (a parallel seed process), is completed, the valve 243b is closed to stop the supply of the DS gas. Then, the gas remaining within the process chamber 201, which has not reacted or which has contributed to the aforementioned reaction, or the reaction byproduct is removed from the interior of the process chamber 201 by the processing procedures similar to those of Step 1. At this time, similar to Step 1, the gas or the like remaining within the process chamber 201 may not be completely removed.

[Performing a Predetermined Number of Times]

At the parallel seed step, a cycle which alternately, i.e., non-synchronously or non-simultaneously performs Steps 1 and 2 described above is executed a predetermined number of times (once or more). By performing the parallel seed step, it is possible to perform the following processes and to change the surface state of the wafer 200 to the state illustrated in FIG. 5D.

First, in the bottom portion of the recess, namely on the monocrystalline Si, it is possible to form a first Si film 200e. The first Si film 200e is formed by allowing a Si crystal to homo-epitaxially grow using, as a nucleus, the first seed 200c formed on the monocrystalline Si. The crystal structure of the first Si film 200e becomes a single crystal which inherits the crystallinity of the base. That is to say, the first Si film 200e becomes a monocrystalline Si film (an epitaxial Si film) which is made of the same material as the monocrystalline Si of the base and which has the same lattice constant and the same crystal orientation as those of the monocrystalline Si of the base. The first Si film 200e formed at the parallel seed step may be regarded as a seed layer. In this case, the seed layer is composed of an epitaxial Si layer. The seed layer composed of the epitaxial Si layer may be referred to as a first seed layer.

In the side portion and the top portion of the recess, namely on the insulation film 200a, it is possible to form a seed layer 200f. The seed layer 200f is formed by allowing the second seed 200d to grow on the insulation film 200a at a high density. The seed layer 200f becomes a layer which densely covers the surface of the insulation film 200a. The crystal structure of the seed layer 200f becomes an amorphous, a poly or a mixture of the amorphous and the poly. That is to say, the seed layer 200f becomes an amorphous Si layer, a poly Si layer or an amorphous/poly-mixed Si layer. The seed layer 200f may be referred to as a second seed layer.

As described above, at the parallel seed step, the first seed layer (the epitaxial Si layer) and the second seed layer (the amorphous Si layer, the poly Si layer or the amorphous/poly-mixed Si layer) are formed in parallel on the monocrystalline Si and the insulation film 200a, respectively. That is to say, at the parallel seed step, two kinds of Si seed layers differing in crystal structure from each other are formed in parallel. This is why this step is called the parallel seed step.

[Processing Conditions of Parallel Seed Step]

At Step 1, the supply flow rate of the DCS gas controlled by the WC 241a is set to fall within a range of, e.g., 10 to 1,000 sccm, and in some embodiments, 10 to 500 sccm. The time period for supplying the DCS gas to the wafer 200, namely the gas supply time (irradiation time), is set to fall within a range of, e.g., 0.5 to 10 minutes, and in some embodiments, 1 to 5 minutes.

At Step 2, the supply flow rate of the DS gas controlled by the WC 241b is set to fall within a range of, e.g., 10 to 1,000 sccm, and in some embodiments, 10 to 500 sccm. The time period for supplying the DS gas to the wafer 200, namely the gas supply time (irradiation time), is set to fall within a range of, e.g., 0.5 to 10 minutes, and in some embodiments, 1 to 5 minutes.

At Steps 1 and 2, the supply flow rate of the $N_2$ gas controlled by the MFCs 241d and 241e is set to fall within a range of, e.g., 100 to 10,000 sccm.

At Steps 1 and 2, the internal pressure of the process chamber 201 is set to fall within a range of, e.g., 1 to 1,000 Pa, and in some embodiments, 1 to 100 Pa.

At Steps 1 and 2, the temperature of the heater 207 is set such that the temperature of the wafer 200 becomes a temperature (a first temperature) which falls within a range of, e.g., 350 to 450 degrees C., and in some embodiments, 370 to 390 degrees C.

If the temperature of the wafer 200 is less than 350 degrees C., DS supplied at Step 2 is hardly decomposed. Thus, it is sometimes difficult to form the first seed 200c and the second seed 200d, namely the first Si film 200e and the seed layer 200f, on the wafer 200. The aforementioned problem may be solved by setting the temperature of the wafer 200 at 350 degrees C. or more. By setting the temperature of the wafer 200 at 370 degrees C. or more, it is possible to promote decomposition of DS supplied at Step 2 and to reliably generate the breaking reaction of the aforementioned Si—O bonds using DCS supplied at Step 1. That is to say, it is possible to reliably provide an environment, in which homo-epitaxial growth easily occurs in the bottom portion of the recess, and to reliably perform the formation of the Si adsorption sites in the side portion and the top portion of the recess. It is also possible to reliably perform the formation of the first seed 200c and the second seed 200d, namely the formation of the first Si film 200e and the seed layer 200f, on the wafer 200.

If the temperature of the wafer 200 exceeds 450 degrees C., there may be a case where Si contained in DCS supplied at Step 1 is deposited on the wafer 200. In this case, Si is deposited before the natural oxide film is removed from the surface of the monocrystalline Si. For that reason, homo-epitaxial growth does not occur on the monocrystalline Si (the natural oxide film). An amorphous Si film or a poly Si film grows on the monocrystalline Si (the natural oxide film). Furthermore, if the temperature of the wafer 200 exceeds 450 degrees C., there may be a case where it becomes difficult to generate the breaking reaction of the aforementioned Si—O bonds using DCS. As a result, it is sometimes difficult to form the first seed 200c and the second seed 200d, namely the first Si film 200e and the seed layer 200f, on the wafer 200. The aforementioned problem may be solved by setting the temperature of the wafer 200 at 450 degrees C. or less. By setting the temperature of the wafer 200 at 390 degrees C. or less, it becomes possible to reliably generate the breaking reaction of the aforementioned Si—O bonds using DCS, while reliably suppressing the deposition of Si contained in DCS on the wafer 200. That is to say, it is possible to reliably provide an environment, in which homo-epitaxial growth easily occurs in the bottom portion of the recess, and to reliably perform the formation of the Si adsorption sites in the side portion and the top portion of the recess. This makes it possible to reliably perform the formation of the first seed 200c and the second seed 200d, namely the formation of the first Si film 200e and the seed layer 200f, on the wafer 200.

Accordingly, the temperature of the wafer 200 may be set to fall within a range of, e.g., 350 to 450 degrees C., and in some embodiments, 370 to 390 degrees C.

The number of execution times of the cycle which alternately performs Steps 1 and 2 is set to fall within a range of, e.g., 1 to 20 times, and in some embodiments, 1 to 10 times. The thickness of the first Si film 200e thus formed and the thickness of the seed layer 200f are respectively set to fall within a range of, e.g., 1 to 50 Å, and in some embodiments, 5 to 20 Å.

As the first process gas, in addition to the DCS gas, it may be possible to use a chlorosilane precursor gas such as a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas or the like. At Step 1, in order to promote the breaking reaction of the aforementioned Si—O bonds while suppressing the deposition of Si on the wafer 200, it may be possible to use, as the first process gas, a halosilane precursor gas which has a small number of Si atoms contained in one molecule and a large number of halogen elements (Cl atoms, etc.) contained in one molecule. At Step 1, in order to appropriately suppress the breaking reaction of the aforementioned Si—O bonds, it may be possible to use a halosilane precursor gas which has a small number of halogen elements (Cl, etc.) contained in one molecule.

As the second process gas, in addition to the DS gas, it may be possible to use a halogen-element-free silane precursor gas such as an MS gas, a trisilane ($Si_3H_8$, abbreviation: TS) gas or the like.

As the inert gas, in addition to the $N_2$ gas, it may be possible to use, e.g., a noble gas such as an Ar gas, a He gas, a Ne gas, a Xe gas or the like.

(CVD Film Forming Step)

After forming the first Si film 200e and the seed layer 200f, an MS gas and a PH gas are supplied to the wafer 200 existing within the process chamber 201.

At this step, the opening/closing control of the valves 243c, 243d and 243e is performed in a procedure similar to the procedure of the opening/closing control of the valves 243a, 243d and 243e at Step 1. The MS gas flowing through the gas supply pipe 232c is flow-rate-controlled by the MFC 241c. The MS gas is supplied into the process chamber 201 through the gas supply pipe 232b and the nozzle 249b and is exhausted from the exhaust pipe 231. At this time, the valve 243a is opened to allow the PH gas to flow through the gas supply pipe 232a. The PH gas is flow-rate-adjusted by the MFC 241a. The PH gas is supplied into the process chamber 201 through the nozzle 249a and is exhausted from the exhaust pipe 231. At this time, the MS gas and the PH gas are collectively and simultaneously supplied to the wafer 200.

Figure 5E:
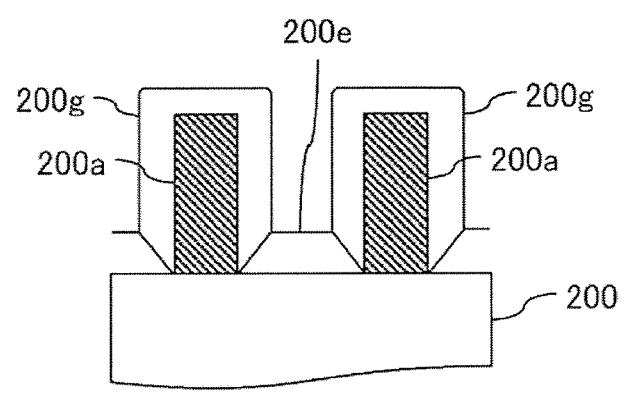
FIG. 5E is a view illustrating a surface structure of a wafer during the progress of a CVD film forming step.
Figure 5F:
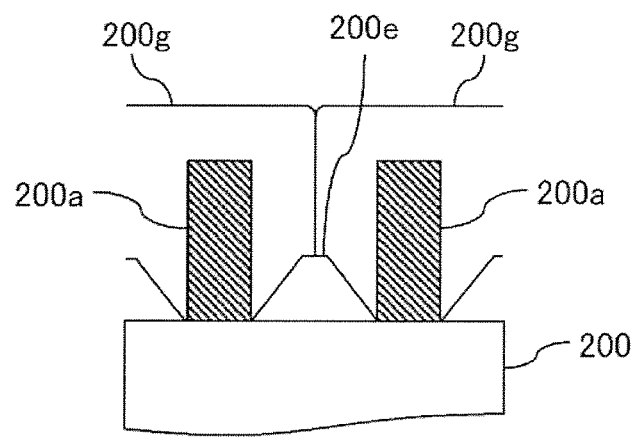
FIG. 5F is a view illustrating a surface structure of a wafer after the completion of a CVD film forming step.

By supplying the MS gas and the PH gas to the wafer 200, it is possible to perform the following processes and to sequentially change the surface state of the wafer 200 to the states illustrated in FIGS. 5E and 5F.

First, as illustrated in FIG. 5E, in the bottom portion of the recess, namely on the monocrystalline Si, the first Si film 200e formed by performing the parallel seed step may be caused to grow homo-epitaxially (in gas phase epitaxy).

Figure 15A:
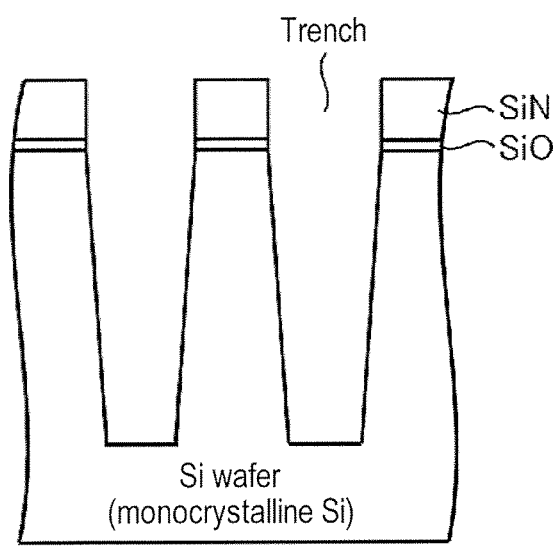
FIGS. 15A to 15H are views illustrating manufacturing processes of a dynamic random access memory (DRAM), respectively.
Figure 15B:
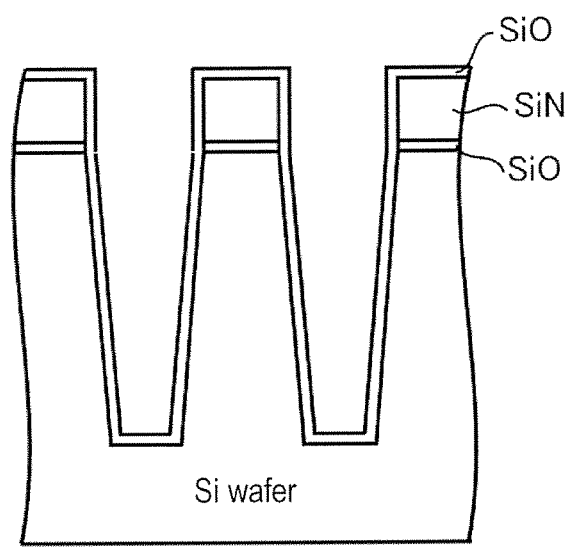
Figure 15C:
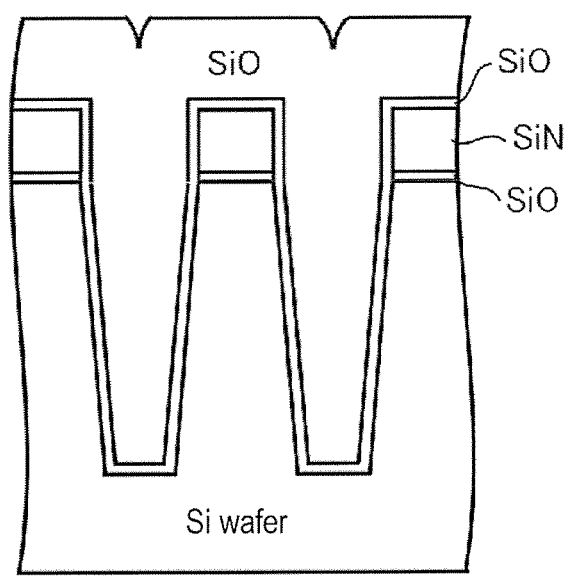
Figure 15D:
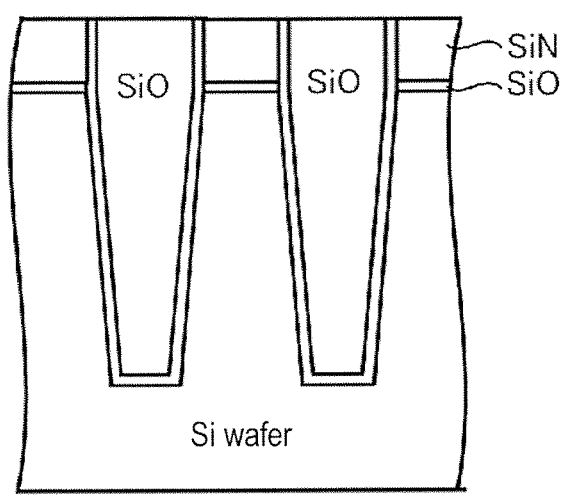

That is, it is possible to additionally grow an epitaxial Si film having the same crystal structure as the first Si film 200e on the first Si film 200e shown in FIG. 15D. By supplying the PH gas together with the MS gas, it is possible to add a P component as a dopant into the first Si film 200e.

Furthermore, as illustrated in FIG. 5E, in the side portion and the top portion of the recess, namely on the insulation film 200a, it is possible to form the second Si film 200g on the seed layer 200f formed by performing the parallel seed step. The crystal structure of the second Si film 200g becomes an amorphous, a poly or a mixture of the amorphous and the poly. That is to say, the second Si film 200g becomes an amorphous Si layer, a poly Si layer or an amorphous/poly-mixed Si layer. Since the seed layer 200f is very thin and is identical in crystal structure and material with the second Si film 200g, the seed layer 200f may be included in the second Si film 200g. By supplying the PH gas together with the MS gas, it is possible to add a P component as a dopant into the second Si film 200g.

By continuously performing the aforementioned processes, the growth of the first Si film 200e may be stopped by the growth of the second Si film 200g. That is to say, as illustrated in FIG. 5F, the top portion of the first Si film 200e may be covered with the second Si film 200g grown from the side portion of the recess, thereby stopping the homo-epitaxial growth of the first Si film 200e. In this state, a laminated structure (a laminated film) including the first Si film 200e and the second Si film 200g laminated on the first Si film 200e is formed within the recess, namely on the wafer 200. The interior of the recess is closed by the laminated film, namely embedded with the laminated film. As described above, in the subject specification, the laminated film may be simply referred to as a Si film.

After the laminated film is formed, the valves 243c and 243a are closed to stop the supply of the MS gas and the PH gas into the process chamber 201. Then, by the processing procedures similar to those of Step 1 described above, the gas remaining within the process chamber 201, which has not reacted or which has contributed to the aforementioned reaction, or the reaction byproduct is removed from the interior of the process chamber 201. At this time, similar to Step 1, the gas or the like remaining within the process chamber 201 may not be completely removed.

[Processing Condition of CVD Film Forming Step]

The supply flow rate of the MS gas controlled by the MFC 241c is set to fall within a range of, e.g., 10 to 2,000 sccm, and in some embodiments, 500 to 1,000 sccm. The time period for supplying the MS gas to the wafer 200, namely the gas supply time (irradiation time), may be appropriately decided depending on the thickness of the Si film formed on the wafer 200.

The supply flow rate of the PH gas controlled by the MFC 241a is appropriately decided depending on the specifications of a device formed on the wafer 200. The supply flow rate of the PH gas may be set to fall within a range of, e.g., 0.1 to 500 sccm, and in some embodiments, 1 to 100 sccm. The time period for supplying the PH gas to the wafer 200, namely the gas supply time (irradiation time), may be appropriately decided depending on the specifications of a device formed on the wafer 200.

The supply flow rates of the $N_2$ gas controlled by the MFCs 241d and 241e may be respectively set to fall within a range of, e.g., 100 to 10,000 sccm.

The internal pressure of the process chamber 201 is set to fall within a range of, e.g., 1 to 1,000 Pa, and in some embodiments, 1 to 100 Pa.

The temperature of the heater 207 is set such that the temperature of the wafer 200 becomes a temperature (a second temperature) equal to or higher than the aforementioned first temperature. Specifically, the temperature of the heater 207 is set such that the temperature of the wafer 200 becomes a temperature (a second temperature) which falls within a range of, e.g., 350 to 650 degrees C., and in some embodiments, 400 to 550 degrees C.

If the temperature of the wafer 200 is less than 350 degrees C., the gas may be hardly decomposed depending on the kind of the third process gas. Consequently, it is sometimes difficult to perform the homo-epitaxial growth of the first Si film 200e or the formation process of the second Si film 200g (hereinafter often referred to as a CVD film forming process). For example, when the DS gas is used as the third process gas, if the temperature of the wafer 200 is less than 350 degrees C., DS is hardly decomposed. This makes it difficult to perform the aforementioned CVD film forming process. This problem may be solved by setting the temperature of the wafer 200 at 350 degrees C. or more. Furthermore, if the temperature of the wafer 200 is set at 400 degrees C. or more, it becomes easy to perform the aforementioned CVD film forming process. For example, when the DS gas is used as the third process gas, if the temperature of the wafer 200 is set at 400 degrees C. or more, it becomes easy to decompose DS. This makes it possible to reliably perform the aforementioned CVD film forming process. Furthermore, when the MS gas is used as the third process gas, if the temperature of the wafer 200 is set at 450 degrees C. or more, it becomes easy to decompose MS. This makes it possible to reliably perform the aforementioned CVD film forming process.

If the temperature of the wafer 200 exceeds 650 degrees C., a CVD reaction becomes too strong (an excessive gas phase reaction is generated). Thus, the film thickness uniformity easily deteriorates and is hardly controllable. Furthermore, there is a possibility that particles are generated within the process chamber 201. This may sometimes reduce the quality of a laminated film formed on the wafer 200. By setting the temperature of the wafer 200 at 650 degrees C. or less, it is possible to generate a proper gas phase reaction. This makes it possible to suppress deterioration of the film thickness uniformity and to control the film thickness uniformity. Moreover, it is possible to suppress generation of particles within the process chamber 201. Particularly, by setting the temperature of the wafer 200 at 550 degrees C. or less, it becomes easy to secure the film thickness uniformity and to control the film thickness uniformity.

Accordingly, the temperature of the wafer 200 may be set at the temperature (the second temperature) which falls within a range of, e.g., 350 to 650 degrees C., and in some embodiments, 400 to 550 degrees C. If the temperature of the wafer 200 is set at a temperature which falls within a range of 350 to 520 degrees C., the second Si film 200g has a strong tendency to become an amorphous Si film. Furthermore, if the temperature of the wafer 200 is set at a temperature which falls within a range of 520 to 530 degrees C., the second Si film 200g has a strong tendency to become an amorphous/poly-mixed Si film. In addition, if the temperature of the wafer 200 is set at a temperature which falls within a range of 530 to 650 degrees C., the second Si film 200g has a strong tendency to become a poly Si film. In either case, the first Si film 200e becomes an epitaxial Si film.

The thickness of the first Si film 200e and the thickness of the second Si film 200g grown at the CVD film forming step are appropriately decided depending on the specifications of a device formed on the wafer 200 and may be, for example, 1 to 5,000 Å.

As the third process gas, in addition to the MS gas, it may be possible to use the aforementioned halogen-element-free hydrogenated silane precursor gas or the aforementioned halosilane precursor gas. From the viewpoint of restraining the halogen element from remaining within the first Si film 200e and the second Si film 200g, the halogen-element-free hydrogenated silane precursor gas may be used as the third process gas. In addition, from the viewpoint of improving the deposition rate of the first Si film 200e and the second Si film 200g, the halosilane precursor gas exhibiting high reactivity may be used as the third process gas.

As the dopant gas, in addition to the PH gas, it may be possible to use a gas containing a Group V element (P, As, etc.), such as an arsine ($AsH_3$) gas or the like. Furthermore, as the dopant gas, in addition to the gas containing a Group V element, it may be possible to use a gas containing a Group III element (B, etc.), such as a diborane ($B_2H_6$) gas, a trichloroborane ($BCl_3$) gas or the like.

As the inert gas, in addition to the $N_2$ gas, it may be possible to use, e.g., a noble gas such as an Ar gas, a He gas, a Ne gas, a Xe gas or the like.

(Annealing Step)

After the formation of the first Si film 200e and the second Si film 200g is completed, the temperature of the heater 207 is appropriately adjusted to thermally treat the first Si film 200e and the second Si film 200g formed on the wafer 200.

This step may be performed in a state in which the valves 243d and 243e are opened to supply the $N_2$ gas into the process chamber 201 or a state in which the valves 243d and 243e are closed to stop the supply of the $N_2$ gas into the process chamber 201. In either case, this step is performed by closing the valves 243a to 243c and stopping the supply of the silane precursor gas into the process chamber 201.

Figure 5G:
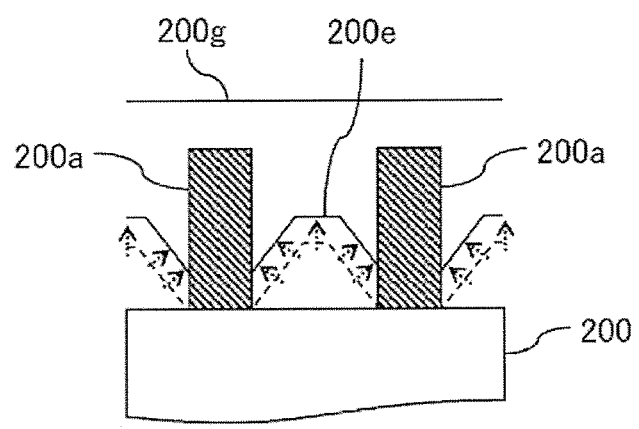
FIG. 5G is a view illustrating a surface structure of a wafer after the completion of an annealing step.

By performing the annealing step, the laminated film of the first Si film 200e and the second Si film 200g formed on the wafer 200 may be changed to the film illustrated in FIG. 5G. That is to say, the portion of the second Si film 200g (the amorphous Si film, the poly Si film or the amorphous/poly-mixed Si film), which makes contact with the first Si film 200e (the homo-epitaxial Si film), may be caused to become homo-epitaxial (grow in solid phase epitaxy) and may be changed (modified) to a homo-epitaxial Si film. In other words, the crystal state of a portion of the second Si film 200g may be changed to the same crystal state as the crystal state of the first Si film 200e. The region changed into a homo-epitaxial state may be regarded as a portion of the first Si film 200e. That is to say, by performing the annealing step, it is possible to expand the region of the laminated film occupied by the first Si film 200e.

[Processing Condition of Annealing Step]

The supply flow rates of the $N_2$ gas controlled by the MFCs 241d and 241e are respectively set to fall within a range of, e.g., 0 to 10,000 sccm.

The internal pressure of the process chamber 201 may be set at a pressure lower than the atmosphere pressure. For example, similar to the parallel seed step or the CVD film forming step, the internal pressure of the process chamber 201 may be set to fall within a range of 1 to 1,000 Pa, and in some embodiments, 1 to 100 Pa.

The temperature of the heater 207 is set such that the temperature of the wafer 200 becomes a temperature (a third temperature) equal to or higher than the aforementioned second temperature. Specifically, the temperature of the heater 207 is set such that the temperature of the wafer 200 becomes a temperature (a third temperature) which falls within a range of, e.g., 500 to 700 degrees C., and in some embodiments, 550 to 600 degrees C.

If the temperature of the wafer 200 is less than 500 degrees C., the solid phase epitaxial growth is difficult to occur. Thus, it is sometimes difficult to make homo-epitaxial the portion of the second Si film 200g, which makes contact with the first Si film 200e. This problem may be solved by setting the temperature of the wafer 200 at 500 degrees C. or more. By setting the temperature of the wafer 200 at 550 degrees C. or more, it is possible to increase the growth efficiency of the solid phase epitaxial growth and to efficiently make homo-epitaxial the portion of the second Si film 200g, which makes contact with the first Si film 200e.

If the temperature of the wafer 200 exceeds 700 degrees C., there may be a case where the portion of the second Si film 200g, which makes contact with the first Si film 200e, does not become homo-epitaxial but becomes a poly. This problem may be solved by setting the temperature of the wafer 200 at 700 degrees C. or less. By setting the temperature of the wafer 200 at 600 degrees C. or less, it becomes easy to allow the portion of the second Si film 200g, which makes contact with the first Si film 200e, to grow in solid phase epitaxy and to become homo-epitaxial.

Accordingly, the temperature of the wafer 200 may be set at the temperature (the third temperature) which falls within a range of, e.g., 500 to 700 degrees C., and in some embodiments, 550 to 600 degrees C. In the aforementioned temperature zone, if the temperature of the wafer 200 is set at a temperature close to the lower limit temperature, namely if the thermal treatment is slowly performed at a temperature close to the lower limit temperature, it is possible to appropriately perform the solid phase epitaxial growth.

As the inert gas, it may be possible to use an inexpensive and highly safe gas. In addition to the $N_2$ gas, it may be possible to use, e.g., a noble gas such as an Ar gas, a He gas, a Ne gas, a Xe gas or the like.

(Purge and Return to Atmospheric Pressure)

If the thermal treatment is completed, the valves 243d and 243e are opened. The $N_2$ gas is supplied into the process chamber 201 from each of the gas supply pipes 232d and 232e, and is exhausted through the exhaust pipe 231. The $N_2$ gas serves as a purge gas. Thus, the interior of the process chamber 201 is purged with the inert gas, and the gas or the reaction byproduct remaining within the process chamber 201 is removed from the interior of the process chamber 201 (purge). Thereafter, the internal atmosphere of the process chamber 201 is substituted with the inert gas (inert gas substitution), and the internal pressure of the process chamber 201 is returned to the atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved, as follows.

(a) At the parallel seed step, by performing Step 1 of supplying the DCS gas containing an halogen element to the wafer 200 having a surface on which monocrystalline Si is exposed, it is possible to remove the natural oxide film 200b formed on the surface of the monocrystalline Si and to generate dangling bonds of Si on the surface of the monocrystalline Si. This enables the epitaxial Si film (the first Si film 200e) to grow on the monocrystalline Si. Consequently, the film including the first Si film 200e and the second Si film 200g laminated on the first Si film 200e, namely the laminated film including the epitaxial Si film formed at the side of a lower layer, may be formed on the surface of the wafer 200 (on the monocrystalline Si). Since the laminated film includes the epitaxial Si film formed at the side of a lower layer, the laminated film becomes a high-quality film which is lower in contact resistance with wafer 200 than a Si mono-film composed of only amorphous Si, poly Si or amorphous/poly-mixed Si and which is superior in electrical characteristic. In the case where a halogen-element-free silane precursor gas such as a hydrogenated silane precursor gas or an aminosilane precursor gas containing an amino group in one molecule or the like is used in place of the DCS gas, an epitaxial Si film is difficult to grow on the monocrystalline Si. This makes it difficult to achieve the aforementioned effect.

(b) At the parallel seed step, by performing Step 1 of supplying the DCS gas containing an halogen element to the wafer 200 having a surface on which the insulation film 200a is exposed, it is possible to form Si adsorption sites on the surface of the insulation film 200a. This makes it possible to reliably perform the formation of the second seed 200d, namely the formation of the seed layer 200f, on the insulation film 200a. Consequently, in the case where a recess is formed on the surface of the wafer 200 and the side portion of the recess is configured by the insulation film 200a, it is possible to reliably perform the formation of the second Si film 200g within the recess, namely the embedding of the Si film within the recess. Furthermore, it is possible to have the laminated film (the Si film), which is formed on the wafer 200, become a dense film having no pinhole. It is also possible to have the laminated film (the Si film) become a film exhibiting a high resistance to hydrogen fluoride (HF).

(c) At the parallel seed step, by performing Step 1, it is possible to provide an environment, in which homo-epitaxial growth easily occurs in the bottom portion of the recess, and to form Si adsorption sites in the side portion and the top portion of the recess. This makes it possible to start, without delay, the formation of the first Si film 200e and the seed layer 200f on the wafer 200. Consequently, it is possible to shorten the incubation time (delay of growth) of the laminated film (the Si film) and to enhance the productivity of the film forming process.

(d) At the parallel seed step, by alternately performing the supply of the DCS gas and the supply of the DS gas, it is possible to increase the density of the first seed 200c and the second seed 200d and to prevent the first Si film 200e and the seed layer 200f from growing in an island shape. This makes it possible to enhance the step coverage of the first Si film 200e and the seed layer 200f. Consequently, it is possible to have the Si film, which is formed on the wafer 200, become a dense film having no pinhole. It is also possible to have the Si film become a film exhibiting a high resistance to hydrogen fluoride (HF).

(e) At the parallel seed step, by alternately performing the supply of the DCS gas and the supply of the DS gas, it is possible to restrain an excessive gas phase reaction from being generated within the process chamber 201 and to reduce the amount of particles generated within the process chamber 201.

(f) At the parallel seed step and the CVD film forming step, the film forming efficiency of the finally-formed laminated film and the characteristics thereof such as the film thickness uniformity and the like may be made compatible by using silane precursor gases having different molecular structures (chemical structures), namely silane precursor gases differing in material from each other.

For example, at the parallel seed step, by using, as the second process gas, the DS gas which has two Si atoms in one molecule and which is lower in pyrolysis temperature (more easily decomposable) and higher in adsorption efficiency than the MS gas used at the CVD film forming step, it is possible to enhance the generation efficiency of the first seed 200c and the second seed 200d. This makes it possible to enhance the formation efficiency of the first Si film 200e and the seed layer 200f. That is to say, by using the DS gas as the second process gas and using the MS gas as the third process gas, as compared with a case where the MS gas is used as the second and third gases, it is possible to enhance the film forming efficiency of the laminated film formed on the wafer 200.

For example, at the CVD film forming step, by using, as the third process gas, the MS gas which has one Si atom in one molecule and which is higher in pyrolysis temperature (more hardly decomposable) and lower in adsorption efficiency than the DS gas used at the parallel seed step, it is possible to appropriately control the deposition rates of the first Si film 200e and the second Si film 200g. This makes it possible to improve the characteristics, such as the in-plane film thickness uniformity, the step coverage and the like, of the first Si film 200e and the second Si film 200g. That is to say, by using the DS gas as the second process gas and using the MS gas as the third process gas, as compared with a case where the DS gas is used as the second and third gases, it is possible to improve the characteristics, such as the in-plane film thickness uniformity, the step coverage and the like, of the laminated film formed on the wafer 200.

By performing the annealing step, it is possible to further improve the quality of the laminated film formed on the wafer 200. For example, the portion of the second Si film 200g, which makes contact with the first Si film 200e, is caused to become homo-epitaxial (grow in solid phase epitaxy), and the region of the laminated film occupied by the first Si film 200e (the homo-epitaxial Si film) is expanded. This makes it possible to further reduce the contact resistance of the laminated film. Furthermore, by performing, e.g., the annealing step, it is possible to make the laminated film denser and to have the laminated film become a film exhibiting a higher resistance to HF.

(h) The aforementioned effects may be equally achieved even when a halosilane gas other than the DCS gas is used as the first process gas, a hydrogenated silane gas other than the DS gas is used as the second process gas, a hydrogenated silane gas other than the MS gas is used as the third process gas, and a dopant gas other than the PH gas is used as the dopant gas.

(4) Modifications

The film forming sequence according to the present embodiment is not limited to the form described above and may be modified as in the modifications to be described below.

Modification 1

Figure 6:
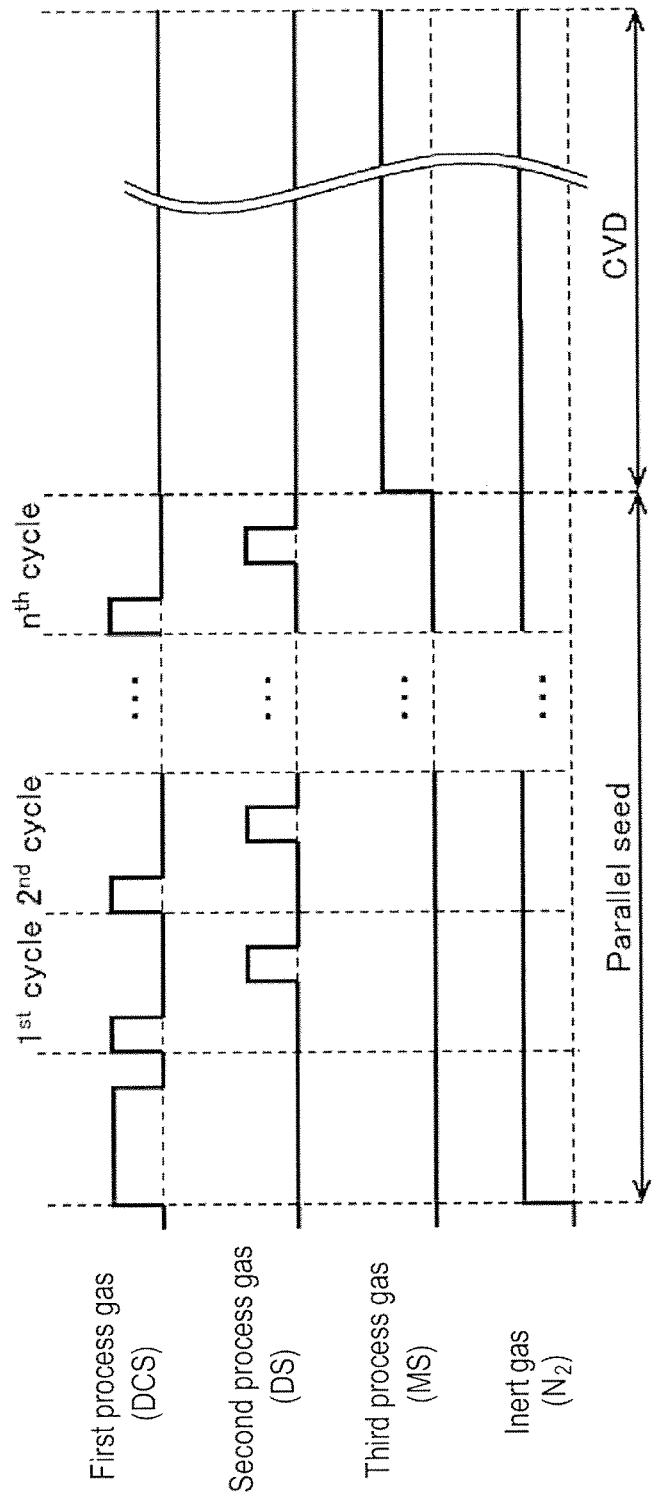
FIG. 6 is a view illustrating modification 1 of gas supply timings in a film forming sequence according to one embodiment of the present disclosure.

As can be noted in a film forming sequence illustrated in FIG. 6 or the subsequent drawings, at the parallel seed step, a step (pre-cleaning step) of supplying a DCS gas to the wafer 200 may be performed prior to starting the cycle which alternately performs Steps 1 and 2. Even in this modification, it is possible to achieve the same effects as those achieved in the film forming sequence illustrated in FIG. 4. It is also possible to reliably obtain the aforementioned action exercised by supplying the DCS gas to the wafer 200. Particularly, by making the supply time of the DCS gas at the pre-cleaning step longer than the supply time of the DCS gas at Step 1, it is possible to further reliably obtain the aforementioned action exercised by supplying the DCS gas to the wafer 200.

$$[DCS \rightarrow (DCS \rightarrow DS) \times n \rightarrow MS] \rightarrow ANL \Rightarrow Si$$

Modification 2

Figure 7:
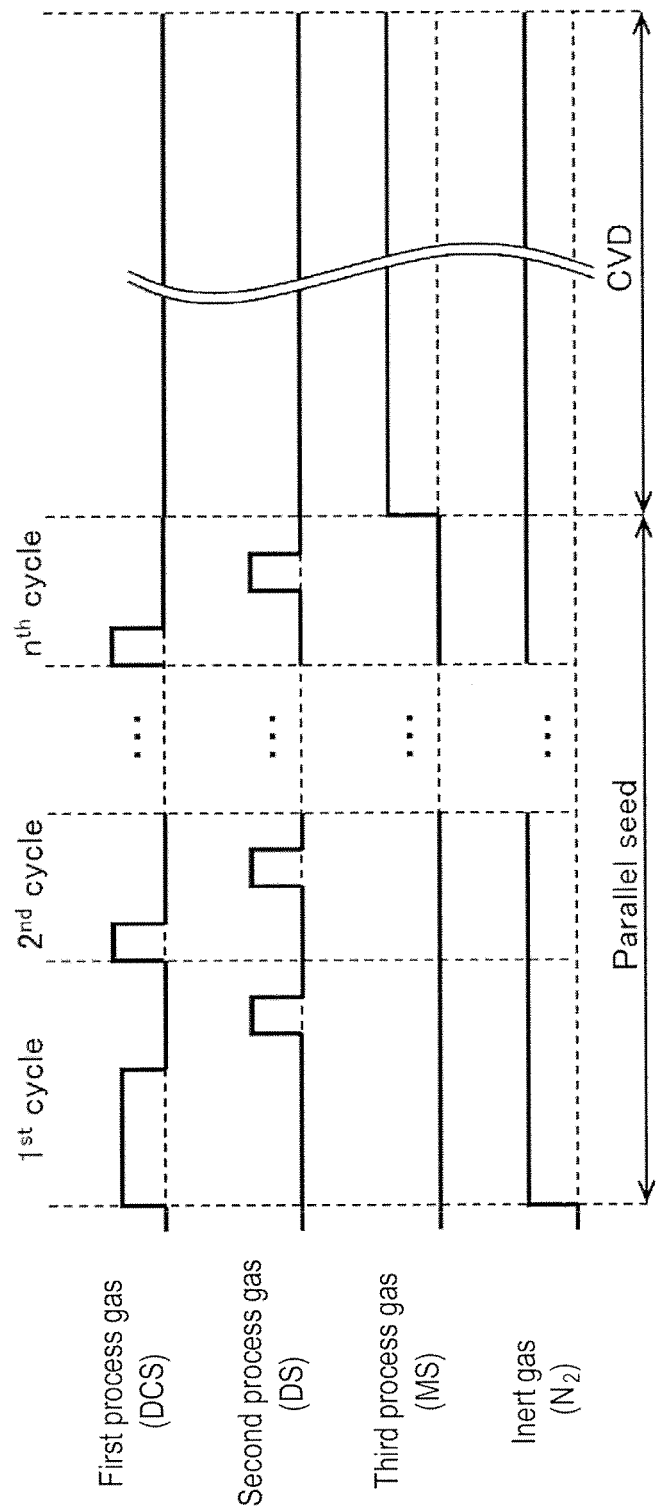
FIG. 7 is a view illustrating modification 2 of gas supply timings in a film forming sequence according to one embodiment of the present disclosure.

As can be noted in a film forming sequence illustrated in FIG. 7, at the parallel seed step, when the cycle which alternately performs Steps 1 and 2 is executed a predetermined number of times, the supply time of the DCS gas at Step 1 of the first cycle may be set longer than the supply time of the DCS gas at Step 1 of the subsequent cycles. Even in this modification, it is possible to achieve the same effects as those achieved in the film forming sequence illustrated in FIG. 4. It is also possible to reliably obtain the aforementioned action exercised by supplying the DCS gas to the wafer 200.

Modification 3

Figure 8:
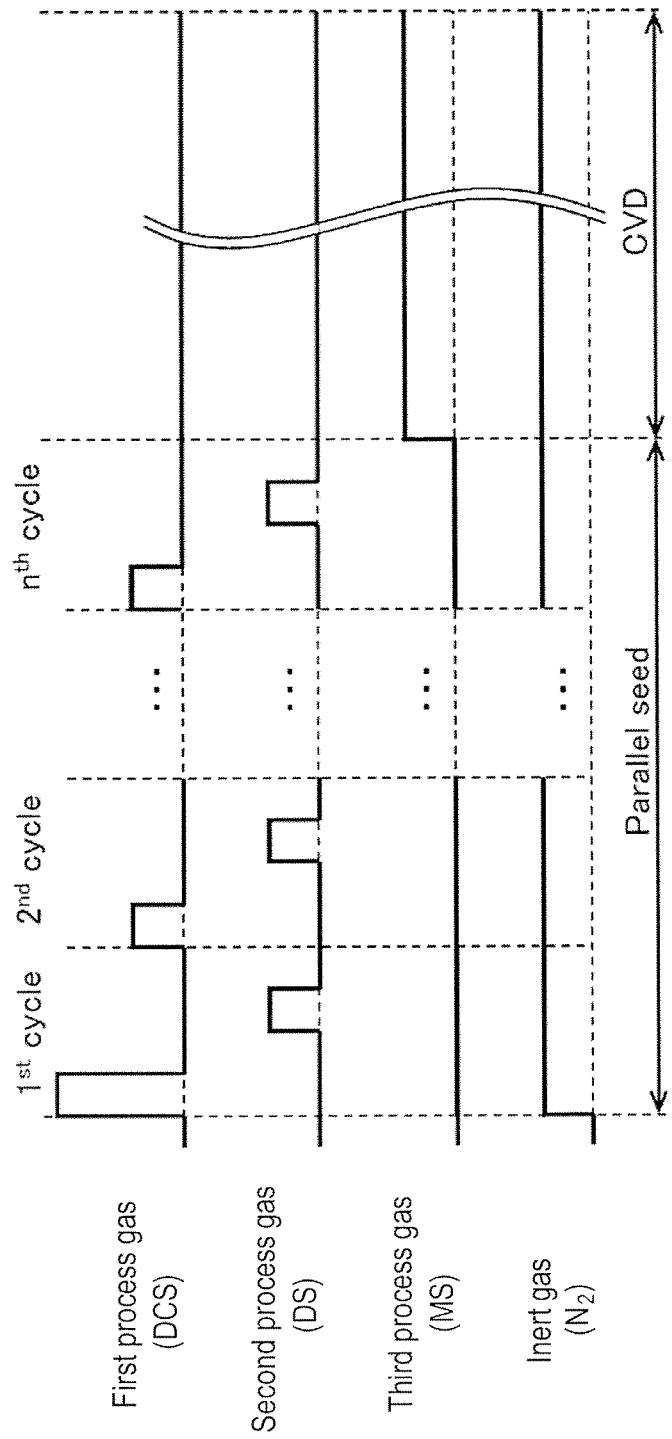
FIG. 8 is a view illustrating modification 3 of gas supply timings in a film forming sequence according to one embodiment of the present disclosure.

As can be noted in a film forming sequence illustrated in FIG. 8, at the parallel seed step, when the cycle which alternately performs Steps 1 and 2 is executed a predetermined number of times, the supply flow rate of the DCS gas at Step 1 of the first cycle may be set larger than the supply flow rate of the DCS gas at Step 1 of the subsequent cycles. Even in this modification, it is possible to achieve the same effects as those achieved in the film forming sequence illustrated in FIG. 4. It is also possible to reliably obtain the aforementioned action exercised by supplying the DCS gas to the wafer 200.

Modification 4

Figure 9:
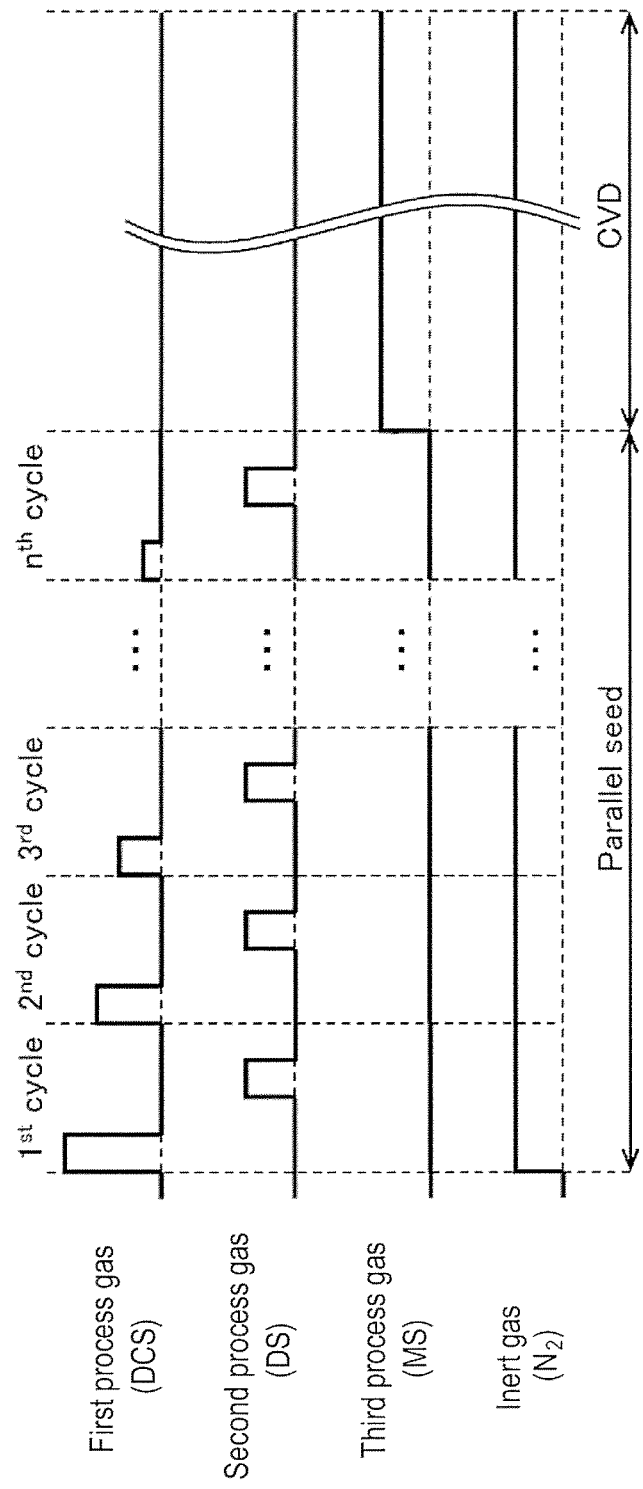
FIG. 9 is a view illustrating modification 4 of gas supply timings in a film forming sequence according to one embodiment of the present disclosure.

As can be noted in a film forming sequence illustrated in FIG. 9, at the parallel seed step, when the cycle which alternately performs Steps 1 and 2 is executed a predetermined number of times, the supply flow rate of the DCS gas at Step 1 may be gradually reduced every time the cycle is executed. Furthermore, at the parallel seed step, when the cycle which alternately performs Steps 1 and 2 is executed a predetermined number of times, the supply time of the DCS gas at Step 1 may be gradually shortened every time the cycle is executed. Even in this modification, it is possible to achieve the same effects as those achieved in the film forming sequence illustrated in FIG. 4 and achieved in modifications 1 to 3. In addition, by reducing the supply flow rate or the supply time of the DCS gas during the course of the parallel seed step, it is possible to reduce the amount of the DCS gas used and to reduce the film forming cost.

Modification 5

Figure 10:
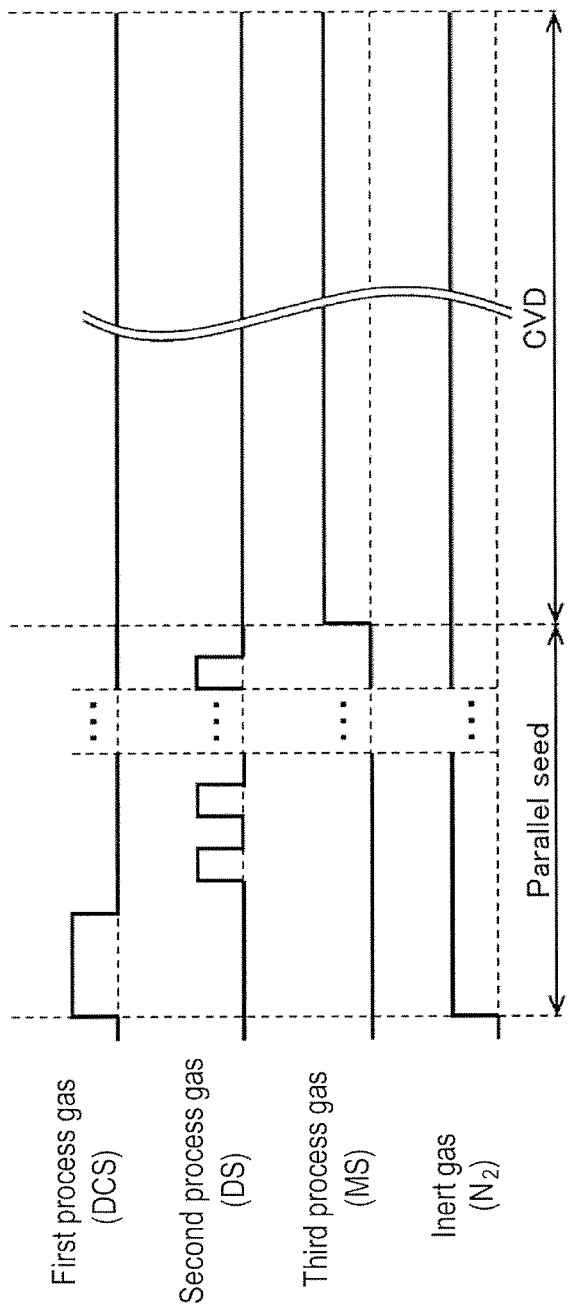
FIG. 10 is a view illustrating modification 5 of gas supply timings in a film forming sequence according to one embodiment of the present disclosure.

As can be noted in a film forming sequence illustrated in FIG. 10 or the subsequent drawings, at the parallel seed step, after performing Step 1, Step 2 may be intermittently performed a plurality of times. Even in this modification, it is possible to achieve the same effects as those achieved in the film forming sequence illustrated in FIG. 4. Furthermore, by not performing the supply of the DCS gas during the course of the parallel seed step, it is possible to reduce the use amount of the DCS gas and to reduce the film forming cost. Moreover, by setting the supply time of the DCS gas at Step 1 of this modification to become longer than the supply time of the DCS gas at Step 1 of the film forming sequence illustrated in FIG. 4, it is possible to reliably obtain the aforementioned action exercised by supplying the DCS gas to the wafer 200. In addition, by setting the supply flow rate of the DCS gas at Step 1 of this modification to become larger than the supply flow rate of the DCS gas at Step 1 of the film forming sequence illustrated in FIG. 4, it is possible to reliably obtain the aforementioned action exercised by supplying the DCS gas to the wafer 200.

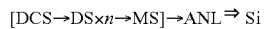

[DCS→DS×n→MS]→ANL ⇒ Si

Modification 6

Figure 11:
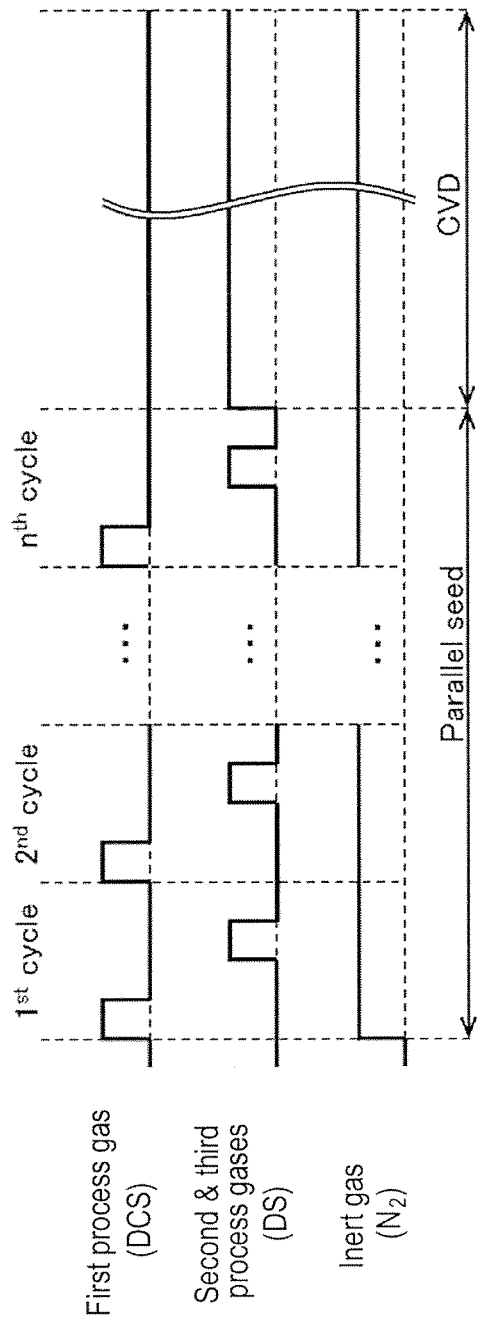
FIG. 11 is a view illustrating modification 6 of gas supply timings in a film forming sequence according to one embodiment of the present disclosure.

As can be noted in a film forming sequence illustrated in FIG. 11 or the subsequent drawings, silane precursor gases having the same molecular structure, namely silane precursor gases identical in material with each other, may be used as the second and third process gases. FIG. 11 illustrates a case where a DS gas is used as the second and third process gases. Even in this modification, it is possible to achieve the same effects as those achieved in the film forming sequence illustrated in FIG. 4. Furthermore, if the DS gas lower in pyrolysis temperature (higher in adsorptivity) than the MS gas is used as the second and third process gases, it is possible to increase the deposition rate of the Si film formed on the wafer 200 and to improve the productivity of the film forming process. In addition, if the MS gas higher in pyrolysis temperature (lower in adsorptivity) than the DS gas is used as the second and third process gases, it is possible to improve the step coverage and the film thickness uniformity of the Si film formed on the wafer 200.

[(DCS→DS)×n→DS]→ANL ⇒ Si

Modification 7

A chlorosilane precursor gas other than the DCS gas may be used as the first process gas. Film forming sequences, in which an HCDS gas and an MCS gas are used as the first process gas, are illustrated below.

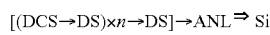

[(HCDS→DS)×n→MS]→ANL ⇒ Si

[(MCS→DS)×n→MS]→ANL ⇒ Si

Even in this modification, it is possible to achieve the same effects as those achieved in the film forming sequence illustrated in FIG. 4. Furthermore, by using the HCDS gas, which is larger in the number of Cl atoms contained in one molecule than the DCS gas, as the first process gas, it is possible to make the aforementioned action exercised by supplying the DCS gas to the wafer 200 stronger than action available in the film forming sequence illustrated in FIG. 4. In addition, by using the MCS gas, which is smaller in the number of Cl atoms contained in one molecule than the DCS gas, as the first process gas, it is possible to appropriately suppress the aforementioned action exercised by supplying the DCS gas to the wafer 200 so as to become weaker than action available in the film forming sequence illustrated in FIG. 4.

Modification 8

Instead of a carbon (C)-free silane precursor gas, a C-containing silane precursor gas, namely a silane precursor gas serving as a C source, may be used as the first process gas. Film forming sequences, in which a 1,1,2,2-tetrachloro-1,2-dimethyldisilane ((CH$_3$)$_2$Si$_2$Cl$_4$, abbreviation: TCD-MDS) gas and a bis(trichlorosilyl)methane ((SiCl$_3$)$_2$CH$_2$, abbreviation: BTCSM) gas are used as the first process gas, are illustrated below.

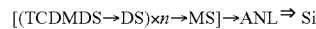

[(TCDMDS→DS)×n→MS]→ANL ⇒ Si

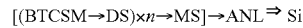

[(BTCSM→DS)×n→MS]→ANL ⇒ Si

Even in this modification, it is possible to achieve the same effects as those achieved in the film forming sequence illustrated in FIG. 4. Furthermore, according to this modification, it is possible to add a small amount of C into the first Si film 200e or the seed layer 200f formed at the parallel seed step. By adding C into the first Si film 200e, it becomes easy to restrain the first Si film 200e from becoming a poly and to make the first Si film 200e become an epitaxial Si film. Furthermore, by adding C into the seed layer 200f, it is possible to reduce the grain size of crystal grains which constitute the seed layer 200f. It is therefore easy to make the seed layer 200f become a dense layer. However, depending on the specifications of a device formed on the wafer 200, there may be a case where it is advisable to avoid the addition of C into the first Si film 200e or the seed layer 200f. In this case, similar to the film forming sequence illustrated in FIG. 4, a C-free hydrogenated silane precursor gas may be used as the first process gas.

Modification 9

A halosilane precursor gas which contains a halogen group other than Cl (a chloro group), for example, a halosilane precursor gas which contains F (a fluoro group), Br (bromo group), I (iodine group) or the like, may be used as the first process gas. As the first process gas, it may be possible to use, e.g., a fluorosilane precursor gas such as a monofluorosilane (SiH$_3$F, abbreviation: MFS) gas, a tetrafluorosilane, i.e., silicon tetrafluoride (SiF$_4$, abbreviation: STF) gas, a trifluorosilane (SiHF$_3$, abbreviation: TFS) gas, a hexafluorodisilane (Si$_2$F$_6$, abbreviation: HFDS) gas or the like, a bromosilane precursor gas such as a monobromosilane (SiH$_3$Br, abbreviation: MBS) gas, a tetrabromosilane, i.e., silicon tetrabromide (SiBr$_4$, abbreviation: STB) gas, a tribromosilane (SiHBr3, abbreviation: TBS) gas, a hexabromodisilane (Si$_2$Br$_6$, abbreviation: HBDS) gas or the like, and an iodosilane precursor gas such as a monoiodosilane (SiH$_3$I, abbreviation: MIS) gas, a tetraiodosilane, i.e., silicon tetraiodide (SiI$_4$, abbreviation: STI) gas, a triiodosilane (SiHI$_3$, abbreviation: TIS) gas, a hexaiododisilane (Si$_2$I$_6$, abbreviation: HIDS) gas or the like. Film forming sequences, in which an STF gas, an STB gas and an STI gas are used as the first process gas, are illustrated below.

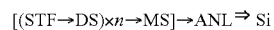

[(STF→DS)×n→MS]→ANL ⇒ Si

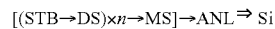

[(STB→DS)×n→MS]→ANL ⇒ Si

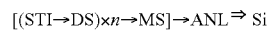

[(STI→DS)×n→MS]→ANL ⇒ Si

Even in this modification, it is possible to achieve the same effects as those achieved in the film forming sequence illustrated in FIG. 4. However, if a gas containing F is used as the first process gas, there may be a case where the film formation base (the surface of the monocrystalline Si or the surface of the insulation film 200a) is pre-etched. In order to suppress the pre-etching, a halosilane precursor gas containing a halogen group other than F may be used as the first process gas.

Modification 10

A Si-free chloro-based gas containing a chloro group may be used as the first process gas. Furthermore, a Si-free halogen-based gas containing a halogen group other than Cl may be used as the first process gas. Film forming sequences, in which a hydrogen chloride (HCl) gas, a chlorine ($Cl_2$) gas, a $BCl_3$ gas and a chlorine fluoride ($ClF_3$) gas are used as the first process gas, are illustrated below.

[(HCl→DS)×n→MS]→ANL ⇒ Si

[($Cl_2$→DS)×n→MS]→ANL ⇒ Si

[($BCl_3$→DS)×n→MS]→ANL ⇒ Si

[($ClF_3$→DS)×n→MS]→ANL ⇒ Si

Even in this modification, it is possible to achieve the same effects as those achieved in the film forming sequence illustrated in FIG. 4. However, if a Si-free halogen-based gas is used as the first process gas, there may be a case where the film formation base (the surface of the monocrystalline Si or the surface of the insulation film 200a) is pre-etched. In order to suppress the pre-etching, a halogen-based gas containing Si, for example, a chlorosilane precursor gas, may be used as the first process gas.

Modification 11

Not only a C- and nitrogen (N)-free silane precursor gas but also a C- and N-containing silane precursor gas, namely a silane precursor gas serving as a C source and an N source, may be used as the second process gas. As the second process gas, it may be possible to use, e.g., an aminosilane precursor gas such as a monoaminosilane ($SiH_3R$) gas, a diaminosilane ($SiH_2RR'$) gas, a triaminosilane ($SiHRR'R''$) gas, a tetraaminosilane ($SiRR'R''R'''$) gas or the like. In this regard, each of R, R', R" and R'" indicates a ligand. As the aminosilane precursor gas, it may be possible to use, e.g., a butyl aminosilane (BAS) gas, a bis-tert-butyl amino silane (BTBAS) gas, a dimethyl aminosilane (DMAS) gas, a bis dimethyl aminosilane (BDMAS) gas, a tridimethyl aminosilane (3DMAS) gas, a diethyl aminosilane (DEAS) gas, a bis diethyl aminosilane (BDEAS) gas, a dipropyl aminosilane (DPAS) gas, a diisopropyl aminosilane (DIPAS) gas or the like. Film forming sequences, in which a BTBAS gas, a 3DMAS gas and a DIPAS gas are used as the second process gas, are illustrated below.

[(HCDS→BTBAS)×n→MS]→ANL ⇒ Si

[(HCDS→3DMAS)×n→MS]→ANL ⇒ Si

[(HCDS→DIPAS)×n→MS]→ANL ⇒ Si

Even in this modification, it is possible to achieve the same effects as those achieved in the film forming sequence illustrated in FIG. 4. Furthermore, according to this modification, similar to modification 8, it is possible to add a small amount of C into the first Si film 200e or the seed layer 200f formed at the parallel seed step. By doing so, it becomes easy to have the first Si film 200e grow homo-epitaxially or to make the seed layer 200f dense. However, depending on the specifications of a device formed on the wafer 200, there may be a case where it is advisable to avoid the addition of C or N into the first Si film 200e or the seed layer 200f. In this case, similar to the film forming sequence illustrated in FIG. 4, a C- and N-free hydrogenated silane precursor gas may be used as the first process gas.

Other Embodiments of the Present Disclosure

One embodiment of the present disclosure has been specifically described above. However, the present disclosure is not limited to the aforementioned embodiment but may be differently modified without departing from the spirit of the present disclosure.

For example, in the aforementioned embodiment, there has been described a case where the wafer 200 having the surface structure illustrated in FIG. 12A is processed. However, the present disclosure is not limited thereto.

Figure 12B:
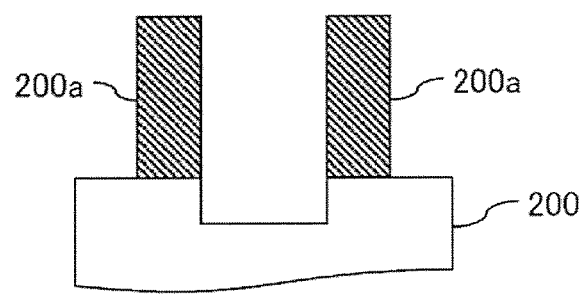
FIG. 12B is a view illustrating surface structure example 2 of a wafer to be processed.
Figure 12C:
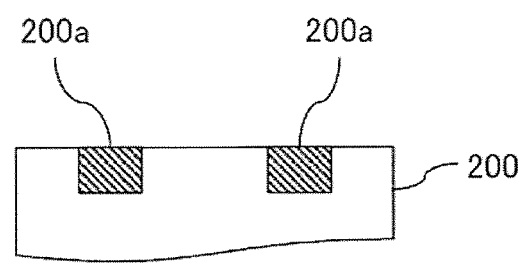
FIG. 12C is a view illustrating surface structure example 3 of a wafer to be processed.
Figure 12D:
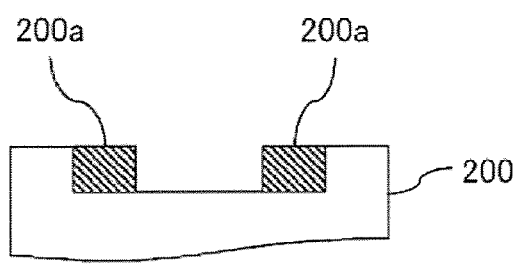
FIG. 12D is a view illustrating surface structure example 4 of a wafer to be processed.

For example, as illustrated in FIG. 12B, the present disclosure may be suitably applied to a case where a recess is formed on the surface of the wafer 200 and an insulation film 200a is formed so as to surround the opening portion of the recess, namely a case where the bottom portion of the recess is formed of the monocrystalline Si and the side portion of the recess is formed of the monocrystalline Si and the insulation film 200a. Furthermore, for example, as illustrated in FIG. 12C, the present disclosure may be suitably applied to a case where recesses are formed on the surface of the wafer 200 and insulation films 200a are formed so as to fill the recesses. Moreover, for example, as illustrated in FIG. 12D, the present disclosure may be suitably applied to a case where a recess is formed on the surface of the wafer 200 and insulation films 200a are formed in the side portions of the recess.

In either case, by performing the parallel seed step and the CVD film forming step illustrated in the aforementioned embodiment, it is possible to have the first Si film 200e homo-epitaxially grow on the monocrystalline Si and to have the second Si film 200g grow on the insulation film 200a. Thus, a laminated structure (a laminated film) including the first Si film and the second Si film formed on the first Si film may be formed on the monocrystalline Si. In addition, by performing the annealing step illustrated in the aforementioned embodiment, it is possible to expand the region of the laminated film occupied by the first Si film.

For example, in the aforementioned embodiment, there has been described a case where the parallel seed step, the CVD film forming step and the annealing step are performed within the same process chamber (in-situ). However, the present disclosure is not limited thereto. As an alternative example, the parallel seed step, the CVD film forming step and the annealing step may be performed within different process chambers (ex-situ). If the series of steps are performed in-situ, the wafer 200 is not exposed to the atmosphere while performing the series of steps. It is therefore possible to consistently process the wafer 200 while keeping the wafer 200 under a vacuum state. This makes it possible to stably process a substrate. If some of the steps are performed ex-situ, the internal temperatures of the respective process chambers may be set in advance at, e.g., the processing temperatures required in the respective steps or the temperatures close to the processing temperatures. This makes it possible to shorten the time required in temperature adjustment and to enhance the production efficiency.

Further, although, in the aforementioned embodiments, modifications or the like, for example, there has been described a case where the annealing step is performed after the first Si film and the second Si film are formed, the annealing step may be omitted. That is, according to the method of the aforementioned embodiments or modifications, it is possible to form an epitaxial Si film, without performing the annealing step, i.e., in an as-deposited state on the interface between the monocrystalline Si and the second Si film. Therefore, there is no need for the annealing step to be necessarily performed in order to obtain such configuration (structure). However, even in this case, if the annealing step is performed, it is possible to enlarge the area of the epitaxial film and to further reduce the contact resistance.

The method of the aforementioned embodiments or modifications can be applied to a manufacturing process for a dynamic random access memory (hereinafter, referred to as "DRAM") which is a volatile semiconductor memory device (volatile memory). Herein below, description on the manufacturing process for the DRAM will be made with reference to FIGS. 15A to 15H and FIGS. 16A to 16G.

Herein, only a part of the manufacturing process for the DRAM will be described for the sake of convenience and description on the remainder of the manufacturing process will be omitted. Further, herein, only a part of the film or structure constituting the DRAM will be described and description on the remainder of the film or structure will be omitted.

First, as shown in FIG. 15A, a trench is formed on the surface of the wafer by etching the surface of the wafer composed of a monocrystalline Si using an SiO film or an SiN film as a hard mask. After that, as shown in FIG. 15B, an SiO film or the like is formed as a liner film on the surface of the wafer in which the trench is formed. The SiO film may be formed by, e.g., a CVD method or a thermal oxidation method. Thereafter, as shown in FIG. 15C, the inside of the trench having the liner film on its surface is buried with an SiO film. The SiO film may be formed by, e.g., a CVD method.

Figure 15E:
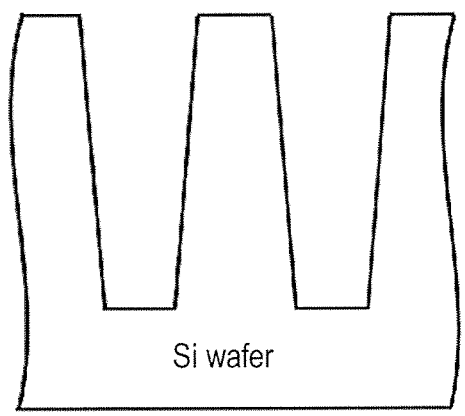
Figure 15F:
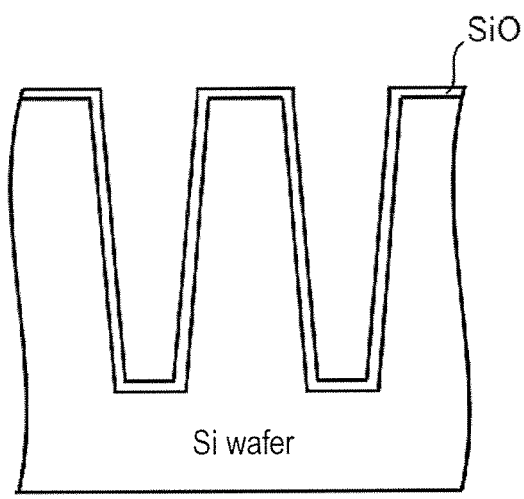

After burying the trench, as shown in FIG. 15D, a planarization process is performed on the surface by CMP. After the planarization, as shown in FIG. 15E, the SiO film, the SiN film, and the like formed on the wafer are removed by dry etching or the like. After that, as shown in FIG. 15F, a liner film is formed again. That is, an SiO film or the like is formed again as a liner film on the surface of the trench. The SiO film may be formed by, e.g., a CVD method.

Figure 15G:
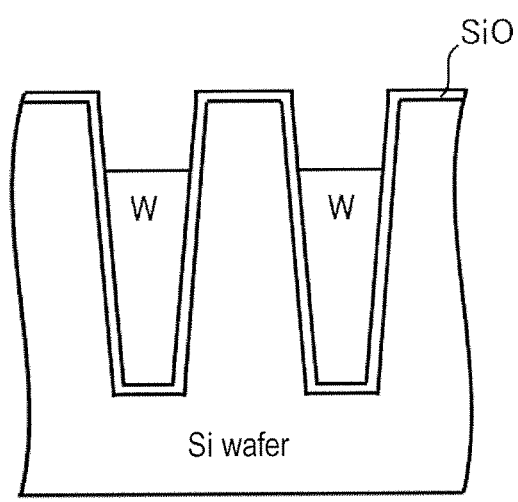
Figure 15H:
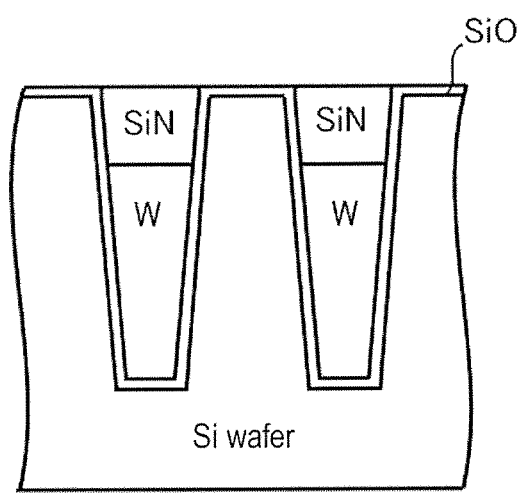

After that, as shown in FIG. 15G, a tungsten film W for the word line is formed on the liner film (SiO film) and the trench is buried with the W film. The W film my be formed by, e.g., a CVD method. After burying the inside of the trench with the W film, a part of the W film (upper portion) is removed by dry etching or the like. FIG. 15G shows a state in which a part of the W film buried in the trench is removed. After that, as shown in FIG. 15H, an SiN film is formed on the W film which is buried in the trench and a part of which is removed. The SiN film may be formed by, e.g., a CVD method. After forming the SiN film, planarization is performed on the surface by CMP. In this way, it is possible to form a structure in which the W film and the SiN film are laminated in the trench. FIG. 15H shows a state available after the surface planarization is performed after the SiN film is formed on the W film in the trench.

Figure 16A:
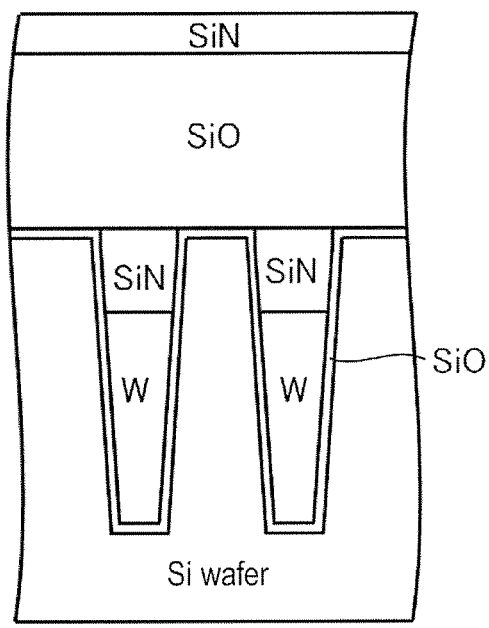
Figure 16B:
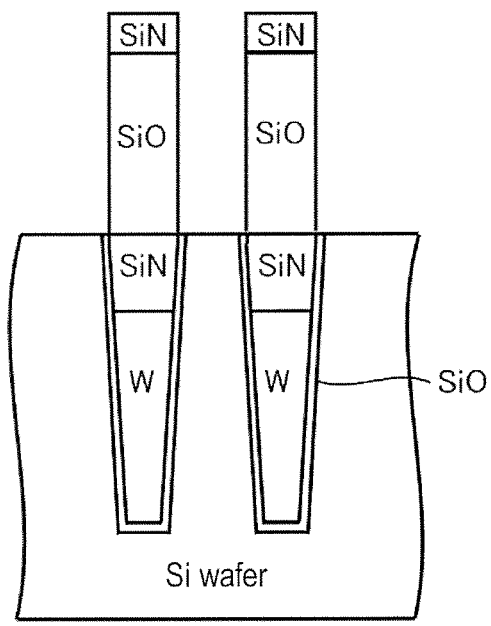
Figure 16C:
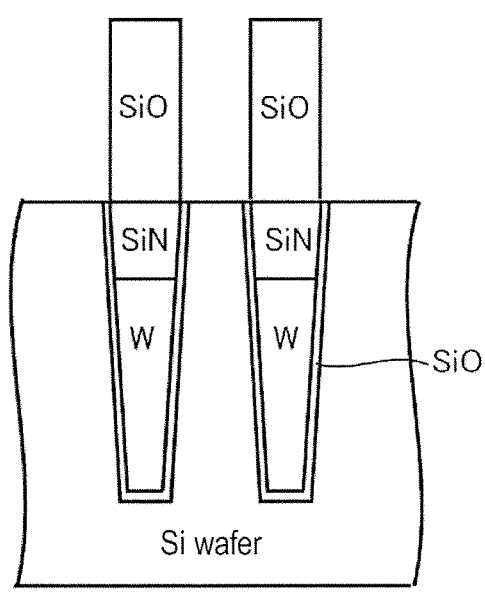

Thereafter, as shown in FIG. 16A, interlayer insulation films such as an SiO film, an SiN film or the like are formed. These films may be formed by, e.g., a CVD method. Thereafter, as shown in FIG. 16B, the SiN film on the SiO film is patterned by lithography, dry etching, and the like. Further, dry etching is performed to the SiO film using the SiN film as a hard mask. In this way, a portion of the SiO film formed on the SiN film formed in the trench is allowed to remain while other parts of the SiO film are removed. Therefore, after the dry etching, the SiO film and the SiN film having served as a hard mask when the SiO film was dry-etched remain on the SiN film formed in the trench. FIG. 16B shows a state available after the SiO film is dry-etched. After that, as shown in FIG. 16C, the SiN film which served as the hard mask when the SiO film was dry-etched is removed by dry etching.

Figure 16D:
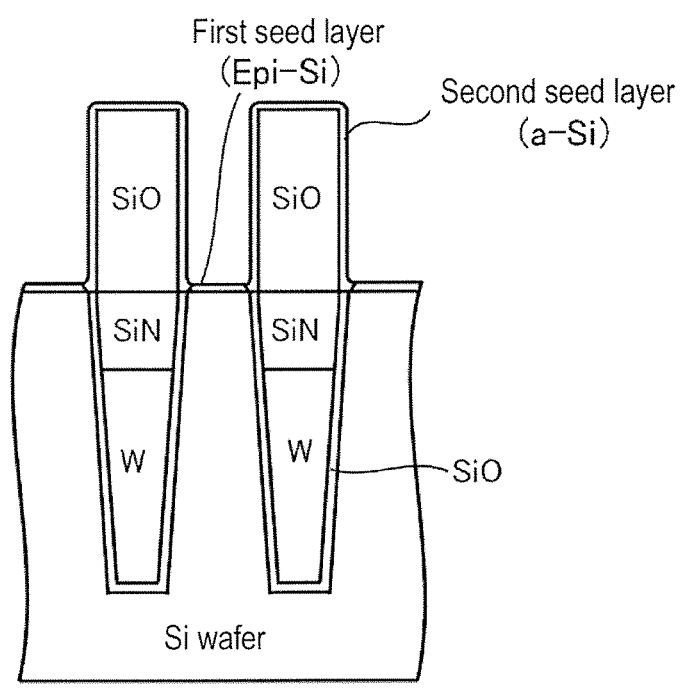

After that, as shown in FIG. 16D, a parallel seed step similar to that in the embodiments or modifications described above is performed, so that a first seed layer (a first Si film) formed of a homo-epitaxial Si layer is formed on a portion in which the surface of the wafer is exposed, i.e., on the monocrystalline Si and a second seed layer formed of an amorphous Si layer, a poly Si layer or an amorphous/poly-mixed Si layer is formed on the SiO film. FIG. 16D illustrates a case where a homo-epitaxial Si (Epi-Si) layer is formed as the first seed layer on the monocrystalline Si and an amorphous Si (a-Si) layer is formed as the second seed layer on the SiO film. In this case, the first seed layer may be referred to as an epitaxial Si seed layer. Further, the second seed layer may be referred to as an amorphous Si seed layer.

Figure 16E:
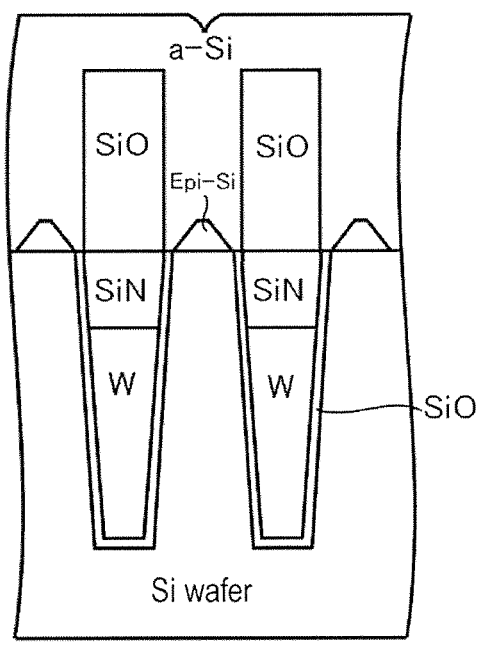

After that, as shown in FIG. 16E, a CVD film forming step similar to that in the embodiments or modifications described above is performed, so that the first seed layer (the first Si film) on the monocrystalline Si is caused to be additionally grown homo-epitaxially (a homo-epitaxial Si film is additionally grown homo-epitaxially on the first seed layer), while the second Si film formed of an amorphous Si layer, a poly Si layer or an amorphous/poly-mixed Si layer is formed on the second seed layer on the SiO film. In this way, an inside of a recess defined by the adjacent SiO films and the monocrystalline Si can be buried with the Si film. Thus, a laminated structure in which the second Si film is formed on the first Si film can be formed on the monocrystalline Si. That is, an epitaxial Si film can be formed on an interface between the monocrystalline Si and the second Si film. FIG. 16E illustrates a case where an epitaxial Si film is formed as the first Si film and an amorphous Si film is formed as the second Si film. That is, FIG. 16E illustrates a case where an epitaxial Si film is formed on an interface between the monocrystalline Si and the amorphous Si film. Further, in this case, as in the embodiments or modifications described above, a dopant such as P, B, As, or the like may be added to the Si film. After that, it may be possible to perform an annealing step similar to that in the embodiments or modifications described above so as to enlarge the area of the epitaxial Si film. Further, according to the method of the aforementioned embodiments or modifications, it is possible to form an epitaxial Si film, without performing the annealing step, i.e., in an as-deposited state, and thus, the annealing step can be omitted. The first Si film and the second Si film serve as a contact plug.

Figure 16F:
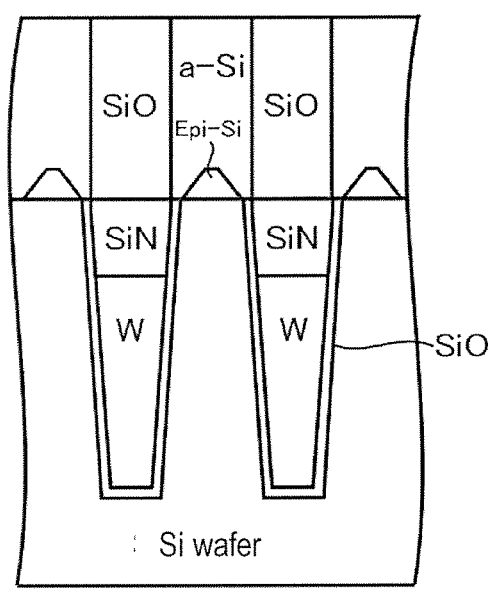

After that, surface planarization is performed by CMP, as shown in FIG. 16F. After the surface planarization, as shown in FIG. 16G, a contact part is formed and, thereafter, a capacitor part is formed. A lower portion of FIG. 16G illustrates a laminated structure including the capacitor part and the contact part in a longitudinal sectional view, while the upper portion of FIG. 16G illustrates a portion of the capacitor part indicated with a broken line in a transverse sectional view.

In this way, major parts of the DRAM are formed.

Even in a case where the method of the embodiments or modifications described above is applied to a manufacturing process for the DRAM, contact resistance can be significantly reduced, thereby enabling large enhancements to the electrical characteristics.

The embodiments or modifications described above can be applied to a manufacturing process for a flash memory which is a non-volatile semiconductor memory device (non-volatile memory). Herein below, a manufacturing process for a three-dimensional NAND type flash memory (hereinafter, referred to as 3DNAND) among other NAND type flash memories which are one kind of the flash memory will be described with reference to FIGS. 17A to 17H. The three-dimensional NAND type flash memory may be simply referred to as a three-dimensional flash memory (three-dimensional non-volatile semiconductor memory device).

Herein, for the sake of convenience, only a part of the manufacturing process for the 3DNAND will be described and description on the remainder thereof will be omitted. Further, herein, for the sake of convenience, only a part of films or structures constituting the 3DNAND will be described and description on the remainder thereof will be omitted.

Figure 17A:
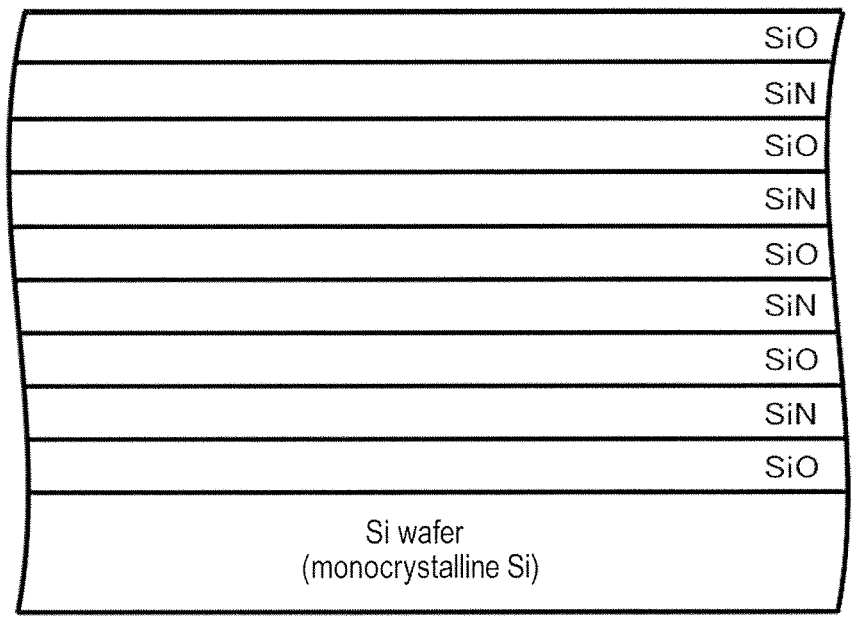
FIGS. 17A to 17H are views illustrating manufacturing processes of a three-dimensional NAND type flash memory (3DNAND), respectively.

First, as shown in FIG. 17A, a multilayer laminated film (hereinafter, simply referred to as a laminated film) in which an SiN film and an SiO film are alternately laminated to form a plurality of layers is formed on the surface of the wafer composed of the monocrystalline Si. Herein, a case where an uppermost layer and a lowermost layer are formed as an SiO film is illustrated. These films may be formed by, e.g., a CVD method. Although a case where the lamination number is 9 is shown FIG. 17A, the present disclosure is not limited to such a configuration. For example, the lamination number may be equal to or higher than 20, and may be equal to or higher than 30 or equal to or higher than 40.

Figure 17B:
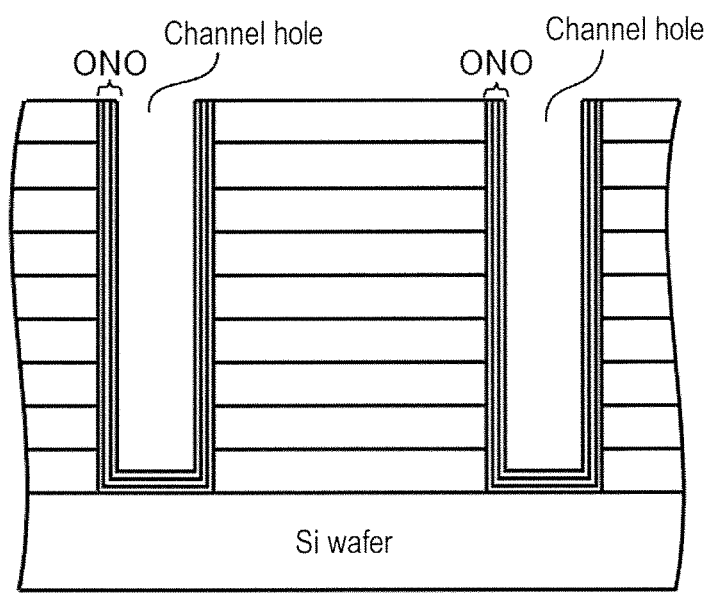

Thereafter, as shown in FIG. 17B, a channel hole is formed in the laminated film by dry etching or the like and an insulation film of an ONO film, that is, a film formed of three layers of the SiO film/the SiN film/the SiO film is formed in the channel hole. These films may be formed by, e.g., a CVD method. FIG. 17B shows a state in which the ONO film is formed in the channel hole formed in the laminated film.

Figure 17C:
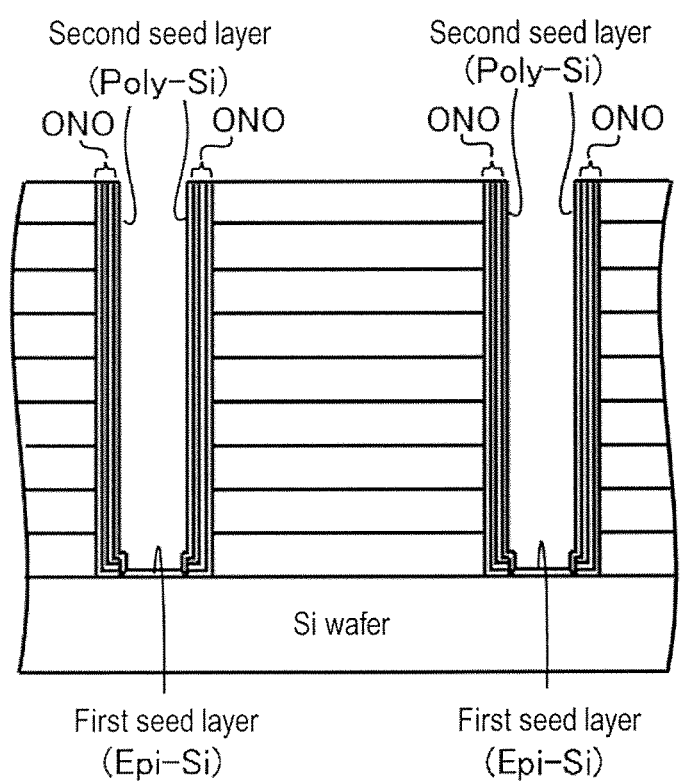

As shown in FIG. 17C, a parallel seed step similar to that in the embodiments or modifications described above is performed in a state where a portion of the ONO film making contact with the wafer is removed. In this way, a first seed layer (a first Si film) formed of a homo-epitaxial Si layer is formed on a portion in which the surface of the wafer is exposed, i.e., on the monocrystalline Si and a second seed layer formed of an amorphous Si layer, a poly Si layer or an amorphous/poly-mixed Si layer is formed on the ONO film (specifically, on the SiO film constituting the ONO film). FIG. 17C illustrates a case where a homo-epitaxial Si (Epi-Si) layer is formed as the first seed layer on the monocrystalline Si and a poly Si (Poly-Si) layer is formed as the second see layer on the SiO film. In this case, the first seed layer may be referred to as an epitaxial Si seed layer. Further, the second seed layer may be referred to as a poly Si seed layer.

Figure 17D:
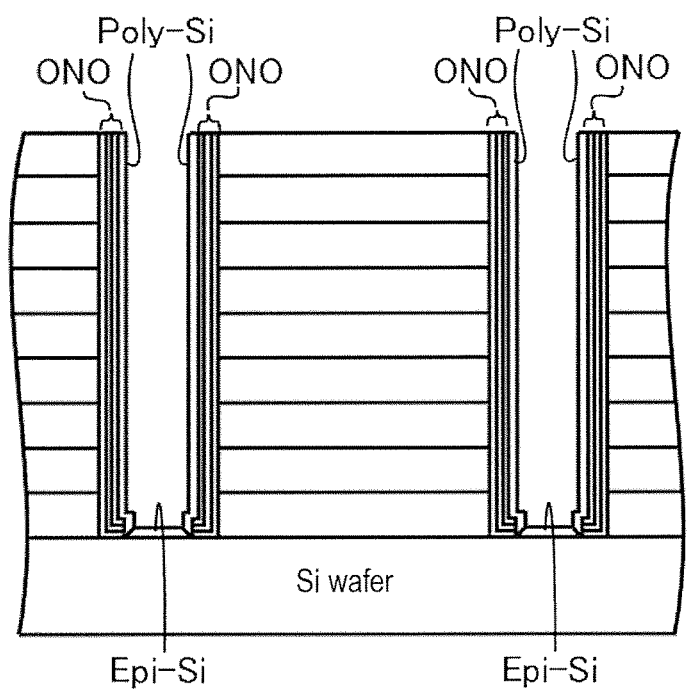

After that, as shown in FIG. 17D, a CVD film forming step similar to that in the embodiments or modifications described above is performed, so that the first seed layer (the first Si film) on the monocrystalline Si is caused to be additionally grown homo-epitaxially (a homo-epitaxial Si film is additionally grown homo-epitaxially on the first seed layer), while the second Si film formed of an amorphous Si layer, a poly Si layer or an amorphous/poly-mixed Si layer is formed on the second seed layer on the ONO film. FIG. 17D illustrates a case where a homo-epitaxial Si (Epi-Si) film is formed as the first Si film and a poly Si (Poly-Si) film is formed as the second Si film. That is, FIG. 17D illustrates a case where an epitaxial Si film is formed on the monocrystalline Si and a poly Si film is formed on the ONO film. Further, in this case, as in the embodiments or modifications described above, a dopant such as P, B, As, or the like may be added to the Si film. The film thickness of the Si film may be set to be equal to or less than 10 nm, for example, 3 to 10 nm and may be further set to be equal to or less than 5 nm, for example, 3 to 5 nm. After that, it may be possible to perform an annealing step similar to that in the embodiments or modifications described above so as to enlarge the area of the epitaxial Si film. Further, according to the method of the aforementioned embodiments or modifications, it is possible to form an epitaxial Si film, without performing the annealing step, i.e., in an as-deposited state, and thus, the annealing step can be omitted. The first Si film and the second Si film serve as a channel. Herein below, these Si films (the first Si film, the second Si film) functioning as a channel may be referred to as a channel Si.

Figure 17E:
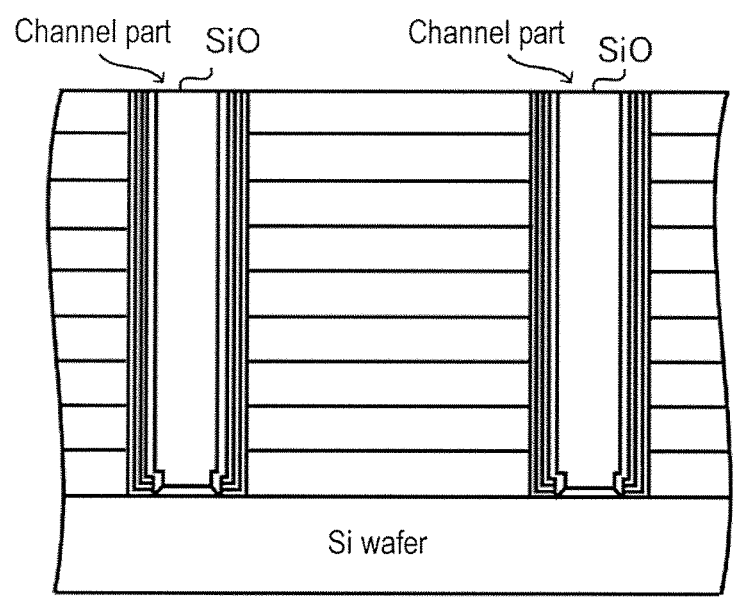

After that, as shown in FIG. 17E, an inside of a recess defined by remaining portions in the channel hole, i.e., the first Si film (an epitaxial Si film) and the second Si film (a poly Si film) is buried with an SiO film. The SiO film may be formed by, e.g., a CVD method.

In this way, the channel part is formed.

Figure 17F:
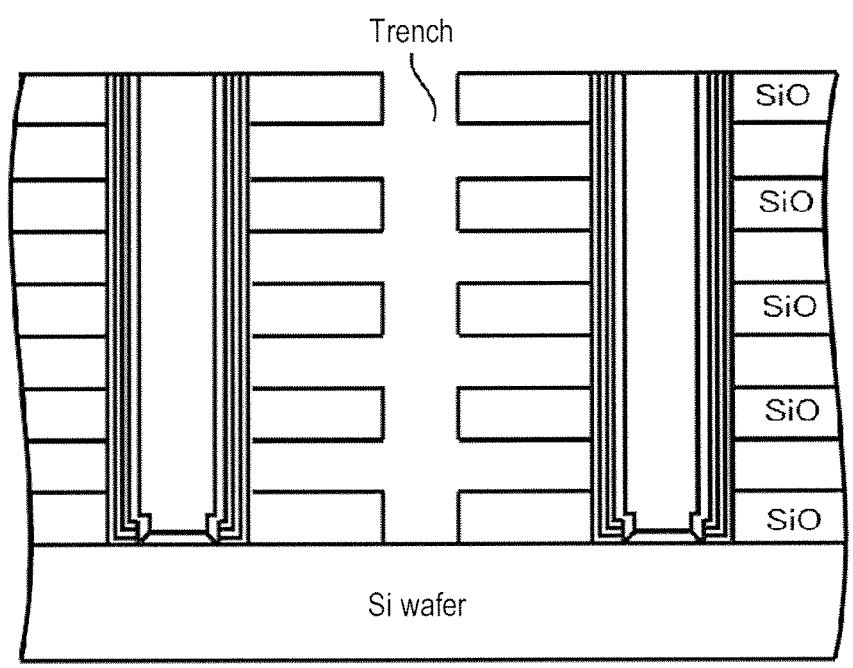

After that, as shown in FIG. 17F, a trench is formed in the multilayer laminated film (a laminated film) in which the SiN film and the SiO film are alternately laminated to form the plurality of layers. The trench can be formed by dry etching or the like. Thereafter, the SiN film constituting the laminated film is removed by dry etching or the like. As a result, the SiO film constituting the laminated film remains. FIG. 17F illustrates a state where the SiN film was removed by dry etching or the like after the forming of the trench.

Figure 17G:
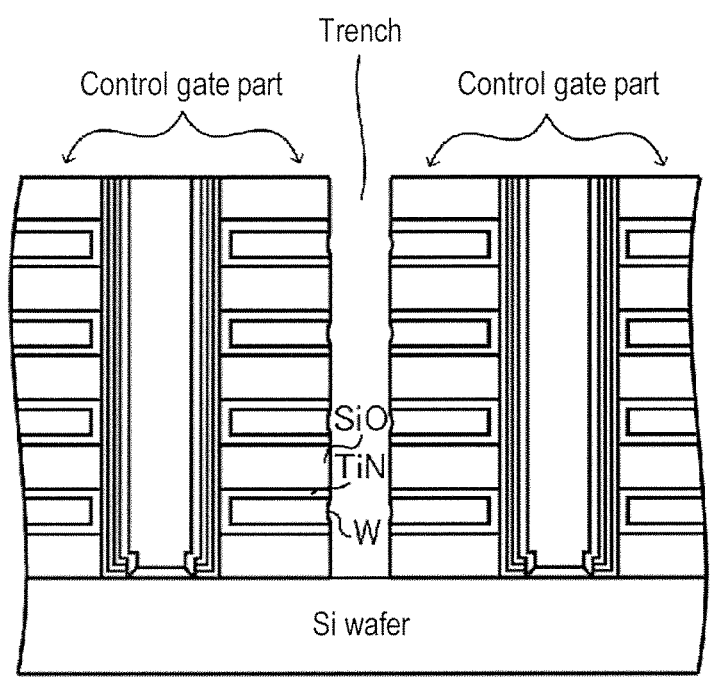

In this state, as shown in FIG. 17G, metal films such as a TiN film, a W film, or the like, which serve as a control gate, are formed in a portion from which the SiN film is removed, i.e., a portion between the vertically adjacent SiO films. These films may be formed by, e.g., a CVD method. After that, the metal films or the like such as the TiN film, the W film, or the like which are formed in the trench (protruding from the portion between the vertically adjacent SiO films) during the film forming process are removed by dry etching or the like. In this way, the trench is formed again. FIG. 17G illustrates a state available after the trench is formed again.

In this way, a control gate part in which the SiO film and the control gate (the TiN film, the W film or the like) are laminated with each other is formed.

Figure 17H:
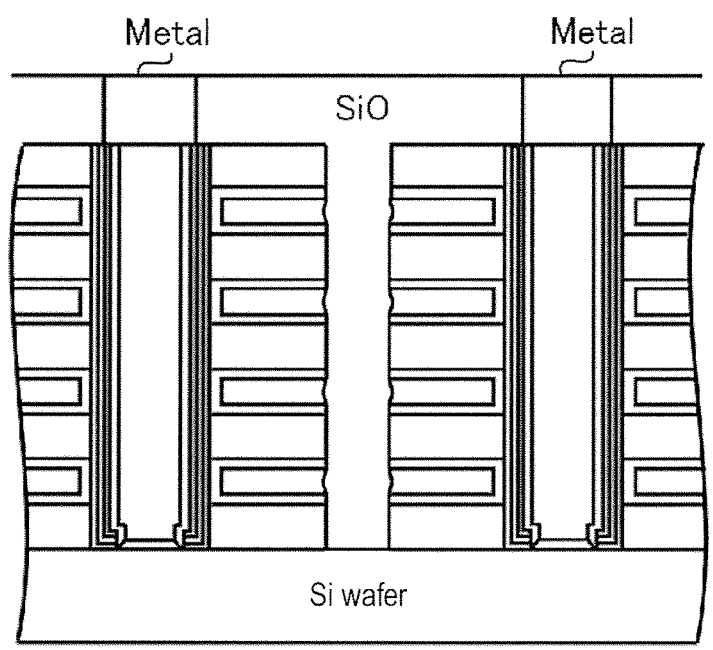

In this state, as shown in FIG. 17H, the inside of the trench is buried with an SiO film or the like. The SiO film may be formed by, e.g., a CVD method. In this case, the SiO film is also formed in upper portions of the control gate part and the channel part. After that, a contact hole is formed in the upper portion of the channel part and a metal film serving as a contact is formed within the contact hole. FIG. 17H illustrates a state available after the metal film is formed within the contact hole.

In this way, major parts of the 3DNAND are formed.

Even in a case where the method of the embodiments or modifications described above is applied to a manufacturing process for the 3DNAND, contact resistance of the Si wafer and the channel Si can be significantly reduced, thereby enabling large enhancements to the electrical characteristics.

Further, by applying the method of the embodiments or modifications described above to the manufacturing process for the 3DNAND, flat and dense seed layers (the first seed layer, the second seed layer) can be formed and thin but flat and dense Si films (the first Si film, the second Si film) can be formed, so that an Si film without having a pin hole (a pin hole-free film) can be obtained. Thus, it is possible to prevent a base film of the Si film from being etched in a wet etching process using HF or the like which is performed after the forming of the Si film. Further, since the thin but flat and dense Si film can be formed, the second Si film (the poly Si film) can be thinned, so that the charge trap density in the crystal grain boundary can be reduced and the electron mobility to the channels of the 3DNAND can be increased.

Recipes (e.g., programs describing processing procedures and processing conditions) used in the substrate processing may be prepared individually (in a plural number) according to the process contents (e.g., the kind, composition ratio, quality, film thickness, processing procedure and processing condition of the film to be formed) and may be stored in the memory device 121c via a telecommunication line or the external memory device 123. Moreover, at the start of the process, the CPU 121a may properly select an appropriate recipe from the recipes stored in the memory device 121c according to the substrate processing contents. This enables a single substrate processing apparatus to form films of different kinds, composition ratios, qualities and thicknesses with enhanced reproducibility. In addition, this configuration makes it possible to reduce an operator's burden (e.g., a burden borne by an operator when inputting processing procedures and processing conditions) and to quickly start the process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiment, there has been described an example in which films are formed using a batch type substrate processing apparatus capable of processing a plurality of substrates at a time. The present disclosure is not limited to the aforementioned embodiment but may be appropriately applied to, e.g., a case where films are formed using a single-substrate-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. In these cases, the processing procedures and the processing conditions may be similar to, e.g., those of the aforementioned embodiment.

Figure 14A:
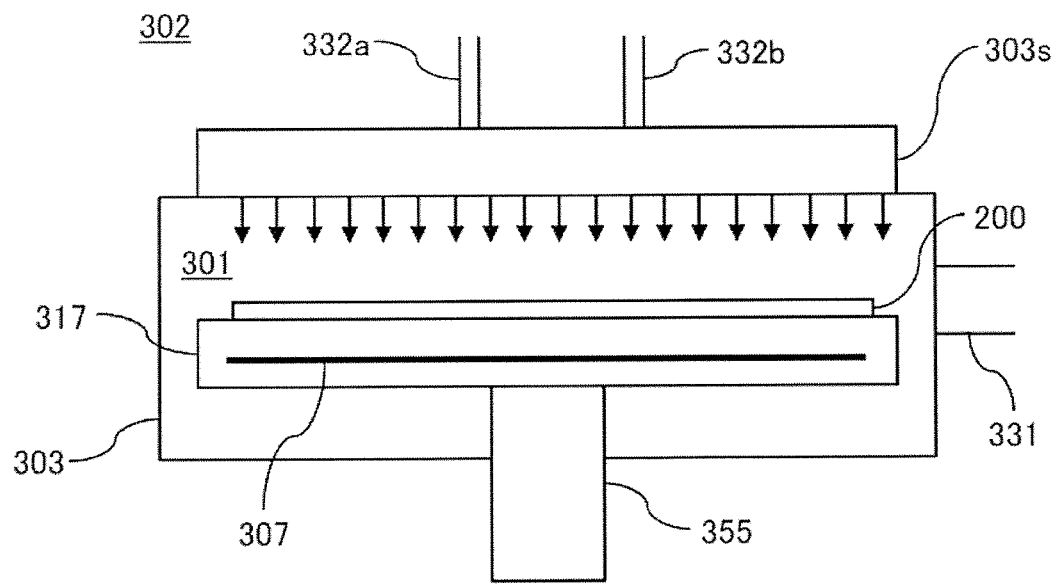
FIG. 14A is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 14A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. Gas supply systems similar to the first process gas supply system and the dopant gas supply system of the above-described embodiment are connected to the gas supply port 332a. Gas supply systems similar to the second process gas supply system and the third process gas supply system of the above-described embodiment are connected to the gas supply port 332b. A gas distribution plate configured to supply a gas into the process chamber 301 in a shower-like manner is installed in outlets (gas discharge holes) of the shower head 303s. The shower head 303s is installed at such a position as to face the surfaces of the wafers 200 carried into the process chamber 301. An exhaust port 331 configured to evacuate the interior of the process chamber 301 is installed in the process vessel 303. An exhaust system similar to the exhaust system of the above-described embodiment is connected to the exhaust port 331.

Figure 14B:
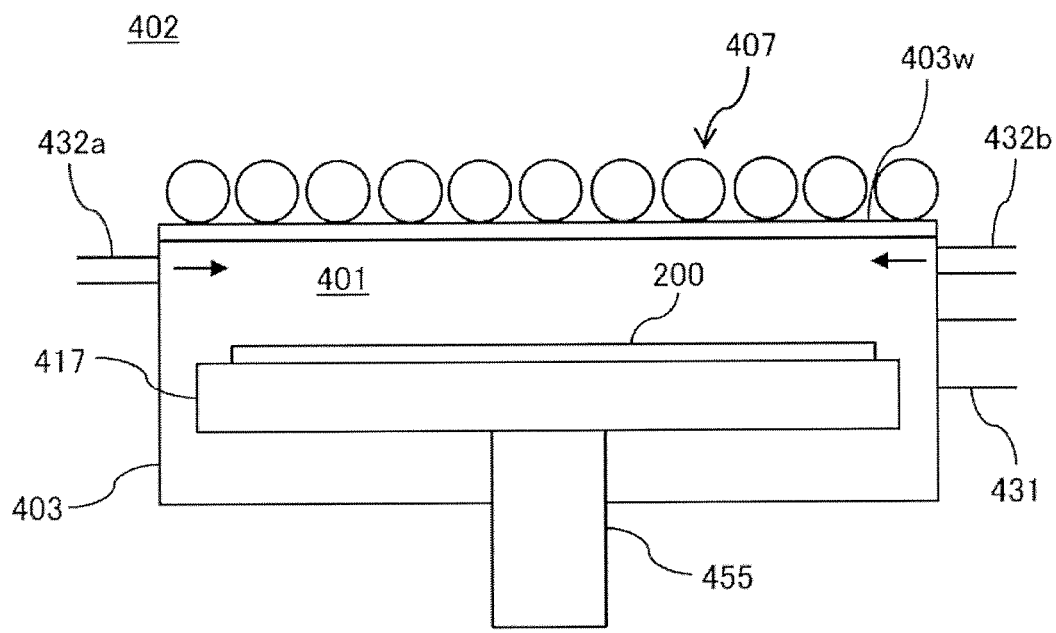
FIG. 14B is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 14B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. Gas supply ports 432a and 432b are connected to the process vessel 403. Gas supply systems similar to the first process gas supply system and the dopant gas supply system of the above-described embodiment are connected to the gas supply port 432a. Gas supply systems similar to the second process gas supply system and the third process gas supply system of the above-described embodiment are connected to the gas supply port 432b. The gas supply ports 432a and 432b are respectively formed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is formed in the process vessel 403. An exhaust system similar to the exhaust system of the above-described embodiment is connected to the exhaust port 431.

In the case of using these substrate processing apparatuses, it is possible to perform film formation by the same sequences and processing conditions as those of the embodiments and modifications described above. It is also possible to achieve the same effects as those achieved in the embodiments and modifications described above.

The embodiments and modifications described above may be appropriately combined with one another. In addition, the processing conditions used at this time may be similar to, e.g., the processing conditions of the embodiments described above.

Example

Next, descriptions will be made on experimental results that support the effects achieved in the embodiments and modifications described above.

As Sample 1, using the substrate processing apparatus of the above-described embodiments and according to the film forming sequence illustrated in FIG. 4, a Si film was formed on a Si wafer having a surface on which monocrystalline Si (a Si wafer surface) and an insulation film ($SiO_2$) are exposed, namely on a Si wafer having a surface on which a recess is formed, the recess including a bottom portion formed of the monocrystalline Si and a side portion and a top portion respectively formed of the insulation film. A DCS gas was used as a first process gas. A DS gas was used as a second process gas. An MS gas was used as a third process gas. The temperature of the Si wafer at a parallel seed step was set to fall within a range of 370 to 390 degrees C. The temperature of the Si wafer at a CVD film forming step was set to fall within a range of 400 to 500 degrees C. Other processing conditions were set to fall within a range of the processing conditions described in the aforementioned embodiments.

As Sample 2, using the substrate processing apparatus of the above-described embodiments and according to the processing procedures similar to those of the CVD film forming step of the above-described embodiments, a Si film was formed on a Si wafer having a surface on which monocrystalline Si and an insulation film ($SiO_2$) are exposed. In Sample 2, a parallel seed step was not performed. An MS gas was used as a third process gas. Processing conditions were similar to those of the CVD film forming step used in producing Sample 1.

Figure 13A:
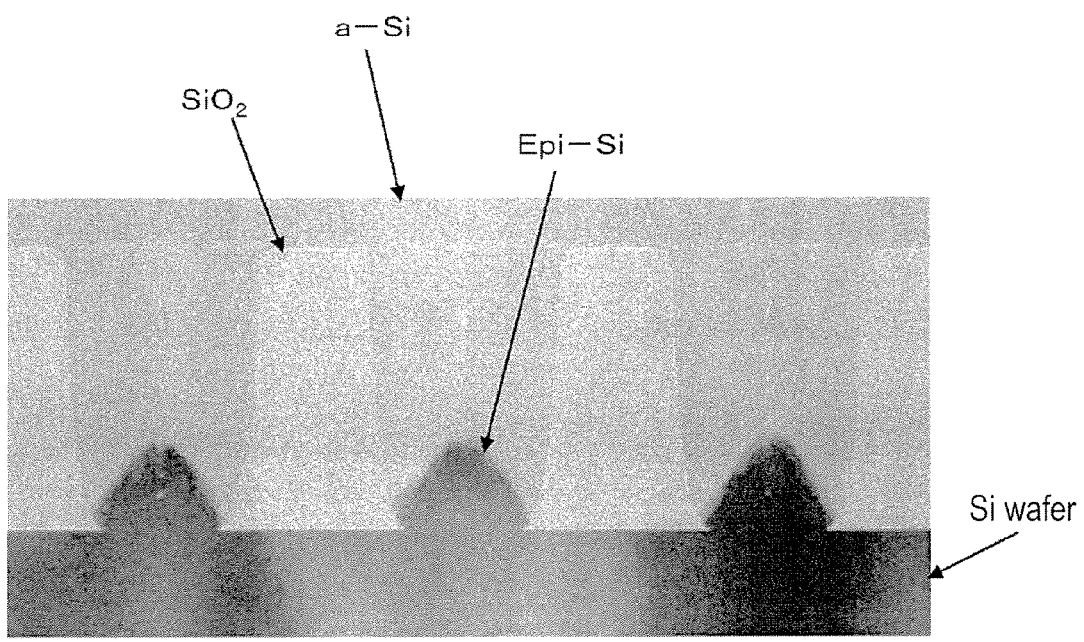
FIG. 13A is a TEM image illustrating a cross-sectional structure of a surface of sample 1 which is subjected to a parallel seed process when forming a Si film.

The cross-sectional structures of the Si films of Samples 1 and 2 were observed using a TEM. FIG. 13A is a TEM image illustrating the cross-sectional structure of the Si film of Sample 1, and FIG. 13B is a TEM image illustrating the cross-sectional structure of the Si film of Sample 2.

According to FIG. 13A, it can be appreciated that a laminated structure including an epitaxial Si film (an Epi-Si film) and an amorphous Si film (an a-Si film) laminated on the epitaxial Si film is formed on the monocrystalline Si (within the recess). Presumably, this is because the natural oxide film formed on the surface of the monocrystalline Si was removed by performing the parallel seed step when producing Sample 1. That is to say, this is because the formation of the Si film was started after desorbing O from the surface of the Si wafer (the surface of the monocrystalline Si) and then providing an environment in which homo-epitaxial growth is easy to occur.

Figure 13B:
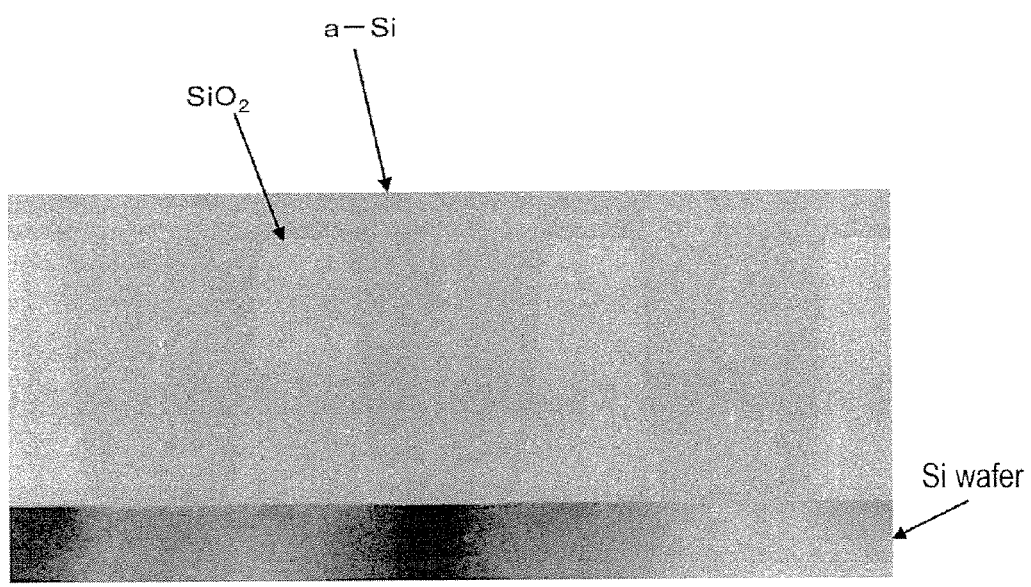
FIG. 13B is a TEM image illustrating a cross-sectional structure of a surface of sample 2 which is not subjected to a parallel seed process when forming a Si film.

According to FIG. 13B, it can be appreciated that an epitaxial Si film did not grow on the monocrystalline Si (within the recess) and only an amorphous Si film (an a-Si film) grew on the monocrystalline Si (within the recess). The reasons for this appear to be as follows. Since the parallel seed step was not performed when producing Sample 2, the natural oxide film is not removed from the surface of the monocrystalline Si. O remains in the interface between the surface (monocrystalline Si) of the Si wafer and the Si film. Thus, there is not provided an environment in which Si grows homo-epitaxially.

As a result of evaluation of the electrical characteristics of the Si films formed in Samples 1 and 2, it was confirmed that the Si film formed in Sample 1 is a high-quality film which is lower in contact resistance than the Si film formed in Sample 2 and superior in electrical characteristic to the Si film formed in Sample 2. As a result of thermally treating the Si film (the laminated film) formed in Sample 1 under the processing procedures and the processing conditions similar to those of the annealing step illustrated in the above-described embodiments, it was confirmed that it is possible to expand the region of the Si film (the laminated film) occupied by the epitaxial Si film and to further improve the electrical characteristics of the Si film.

<Aspects of Present Disclosure>

Hereinafter, the preferred aspects of the present disclosure will be additionally stated.

(Supplementary Note 1)

According to one aspect of the present disclosure, there is provided a three-dimensional flash memory, a dynamic random access memory, or a semiconductor device, including:

a substrate formed of monocrystalline silicon;

an insulation film formed on a surface of the substrate;

a first silicon film formed on the monocrystalline silicon by being homo-epitaxially grown using the monocrystalline silicon as a base; and a second silicon film formed on the insulation film and being different in crystal structure from the first silicon film.

(Supplementary Note 2)

In the three-dimensional flash memory, the dynamic random access memory, or the semiconductor device of Supplementary Note 1, a recess may be formed on the surface of the substrate, the recess including a bottom portion formed of the monocrystalline silicon and a side portion formed of the insulation film. The first silicon film and the second silicon film in the three-dimensional flash memory serve as a channel. The first silicon film and the second silicon film in the dynamic random access memory serve as a contact plug.

(Supplementary Note 3)

In the three-dimensional flash memory, the dynamic random access memory, or the semiconductor device of Supplementary Note 1 or 2, the first silicon film and the second silicon film may be formed by alternately performing supplying a first process gas containing silicon and a halogen element to the substrate having a surface on which the monocrystalline silicon and the insulation film are exposed and supplying a second process gas containing silicon and not containing a halogen element to the substrate, and supplying a third process gas containing silicon to the substrate.

(Supplementary Note 4)

According to another aspect of the present disclosure, there is provided a method of manufacturing a semiconductor device or a substrate processing method, including alternately performing supplying a first process gas containing silicon and a halogen element to a substrate having a surface on which monocrystalline silicon and an insulation film are exposed and supplying a second process gas containing silicon and not containing a halogen element to the substrate; and supplying a third process gas containing silicon to the substrate, whereby a first silicon film is homo-epitaxially grown on the monocrystalline silicon and a second silicon film differing in crystal structure from the first silicon film is grown on the insulation film.

(Supplementary Note 5)

In the method of Supplementary Note 4, in the act of alternately performing the act of supplying the first process gas and the act of supplying the second process gas, the first silicon film may be homo-epitaxially grown on the monocrystalline silicon and a seed layer may be formed on the insulation film, and in the act of supplying the third process gas, the first silicon film may be further homo-epitaxially grown and the second silicon film may be grown on the seed layer.

(Supplementary Note 6)

In the method of Supplementary Note 4 or 5, a recess may be formed on the surface of the substrate, the recess including a bottom portion formed of the monocrystalline silicon and a side portion formed of the insulation film.

(Supplementary Note 7)

In the method of Supplementary Note 6, a top portion of the first silicon film may be covered with the second silicon film grown from the side portion of the recess, so as to stop homo-epitaxial growth of the first silicon film.

(Supplementary Note 8)

In the method of Supplementary Note 6 or 7, a top portion of the first silicon film may be covered with the second silicon film grown from the side portion of the recess, so as to form a laminated structure (a laminated film) including the first silicon film and the second silicon film laminated on the first silicon film.

(Supplementary Note 9)

In the method of any one of Supplementary Notes 4 to 8, a crystal structure of the second silicon film may be an amorphous, a poly (a polycrystal) or a mixture of the amorphous and the poly. That is to say, the second silicon film may be an amorphous silicon film, a poly silicon film or an amorphous/poly-mixed silicon film.

(Supplementary Note 10)

In the method of any one of Supplementary Notes 4 to 9, the first process gas may include silane chloride (compound), the second process gas may include hydrogenated silane (compound), and the third process gas may include hydrogenated silane (compound).

(Supplementary Note 11)

In the method of any one of Supplementary Notes 4 to 10, in the act of supplying the third process gas, a dopant gas together with the third process gas may be supplied to the substrate.

(Supplementary Note 12)

In the method of any one of Supplementary Notes 4 to 11, the second process gas may differ in molecular structure (chemical structure) from the third process gas. That is to say, the second process gas may differ in material from the third process gas.

(Supplementary Note 13)

In the method of any one of Supplementary Notes 4 to 12, a pyrolysis temperature of the second process gas may be lower than a pyrolysis temperature of the third process gas.

(Supplementary Note 14)

In the method of any one of Supplementary Notes 4 to 11, the second process gas may be identical in molecular structure (chemical structure) with the third process gas. That is to say, the second process gas may be identical in material with the third process gas.

(Supplementary Note 15)

The method of any one of Supplementary Notes 4 to 14 may further include thermally treating (annealing) the first silicon film and the second silicon film.

(Supplementary Note 16)

In the method of Supplementary Note 15, in the act of thermally treating the first silicon film and the second silicon film, a portion of the second silicon film which makes contact with the first silicon film (homo-epitaxial silicon film) may be changed into a homo-epitaxial state.

(Supplementary Note 17)

In the method of Supplementary Note 15 or 16, in the act of thermally treating the first silicon film and the second silicon film, a portion of the second silicon film which makes contact with the first silicon film (homo-epitaxial silicon film) may be changed into a homo-epitaxial silicon film.

(Supplementary Note 18)

In the method of any one of Supplementary Notes 15 to 17, in the act of thermally treating the first silicon film and the second silicon film, a region occupied by the first silicon film may be expanded.

(Supplementary Note 19)

In the method of any one of Supplementary Notes 4 to 18, in the act of alternately performing the act of supplying the first process gas and the act of supplying the second process gas, a temperature of the substrate may be set at a first temperature, and in the act of supplying the third process gas, a temperature of the substrate may be set at a second temperature equal to or higher than the first temperature.

(Supplementary Note 20)

In the method of Supplementary Note 19, in the act of thermally treating the first silicon film and the second silicon film, a temperature of the substrate may be set at a third temperature equal to or higher than the second temperature.

(Supplementary Note 21)

According to another aspect of the present disclosure, there is provided a method of manufacturing a semiconductor device or a substrate processing method, including alternately performing supplying a first process gas containing a halogen element to a substrate having a surface on which monocrystalline silicon and an insulation film are exposed and supplying a second process gas containing silicon and not containing a halogen element to the substrate; and supplying a third process gas containing silicon to the substrate, whereby a first silicon film is homo-epitaxially grown on the monocrystalline silicon and a second silicon film differing in crystal structure from the first silicon film is grown on the insulation film.

(Supplementary Note 22)

According to another aspect of the present disclosure, there is provided a substrate processing apparatus, including:

a process chamber configured to accommodate a substrate therein;

a first process gas supply system configured to supply a first process gas containing silicon and a halogen element to the substrate existing within the process chamber;

a second process gas supply system configured to supply a second process gas containing silicon and not containing a halogen element to the substrate existing within the process chamber;

a third process gas supply system configured to supply a third process gas containing silicon to the substrate existing within the process chamber;

a heater configured to heat the substrate existing within the process chamber; and a control part configured to control the first process gas supply system, the second process gas supply system, the third process gas supply system and the heater so as to perform processes of alternately performing supplying the first process gas to the substrate having a surface on which monocrystalline silicon and an insulation film are exposed and supplying the second process gas to the substrate, and supplying the third process gas to the substrate, whereby a first silicon film is homo-epitaxially grown on the monocrystalline silicon and a second silicon film differing in crystal structure from the first silicon film is grown on the insulation film.

(Supplementary Note 23)

According to another aspect of the present disclosure, there is provided a gas supply system including:

a first gas supply part configured to supply a first process gas containing silicon and a halogen element to a substrate;

a second gas supply part configured to supply a second process gas containing silicon and not containing a halogen element to the substrate; and a third gas supply part configured to supply a third process gas containing silicon to the substrate, wherein the first gas supply part, the second gas supply part and the third gas supply part are controlled so as to perform processes of alternately performing supplying the first process gas to the substrate having a surface on which monocrystalline silicon and an insulation film are exposed and supplying the second process gas to the substrate, and supplying the third process gas to the substrate, whereby a first silicon film is homo-epitaxially grown on the monocrystalline silicon and a second silicon film differing in crystal structure from the first silicon film is grown on the insulation film.

(Supplementary Note 24)

According to another aspect of the present disclosure, there is provided a program or a non-transitory computer-readable recording medium storing the program, wherein the program is configured to cause a computer to perform processes of alternately performing supplying a first process gas containing silicon and a halogen element to a substrate having a surface on which monocrystalline silicon and an insulation film are exposed and supplying a second process gas containing silicon and not containing a halogen element to the substrate; and supplying a third process gas containing silicon to the substrate, whereby a first silicon film is homo-epitaxially grown on the monocrystalline silicon and a second silicon film differing in crystal structure from the first silicon film is grown on the insulation film.

According to the present disclosure, it is possible to improve the quality of a Si film formed on a substrate on which monocrystalline Si and an insulation film are exposed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process chamber configured to accommodate a substrate therein;
a first process gas supply system configured to supply a first process gas containing silicon and a halogen element to the substrate existing within the process chamber;
a second process gas supply system configured to supply a second process gas containing silicon and not containing a halogen element to the substrate existing within the process chamber;
a third process gas supply system configured to supply a third process gas containing silicon to the substrate existing within the process chamber;
a heater configured to heat the substrate existing within the process chamber; and
a control part configured to control the first process gas supply system, the second process gas supply system, the third process gas supply system and the heater so as to perform processes of alternately performing supplying the first process gas to the substrate having a surface on which monocrystalline silicon and an insulation film are exposed and supplying the second process gas to the substrate, and supplying the third process gas to the substrate, whereby a first silicon film is homo-epitaxially grown on the monocrystalline silicon and a second silicon film differing in crystal structure from the first silicon film is grown on the insulation film.

2. The apparatus of claim 1, wherein the control part is configured to control the first process gas supply system, the second process gas supply system, the third process gas supply system and the heater so that:
the first silicon film is homo-epitaxially grown on the monocrystalline silicon and a seed layer is formed on the insulation film during the processes of alternately performing supplying the first process gas and supplying the second process gas; and
the first silicon film is further homo-epitaxially grown and the second silicon film is grown on the seed layer during the process of supplying the third process gas.

3. The apparatus of claim 1, wherein a recess is formed on the surface of the substrate, the recess including a bottom portion formed of the monocrystalline silicon and a side portion formed of the insulation film.

4. The apparatus of claim 3, wherein the control part is configured to control the first process gas supply system, the second process gas supply system, the third process gas supply system and the heater so that a top portion of the first silicon film is covered with the second silicon film grown from the side portion of the recess, so as to stop homo-epitaxial growth of the first silicon film.

5. The apparatus of claim 3, wherein the control part is configured to control the first process gas supply system, the second process gas supply system, the third process gas supply system and the heater so that a top portion of the first silicon film is covered with the second silicon film grown from the side portion of the recess, so as to form a laminated structure including the first silicon film and the second silicon film laminated on the first silicon film.

6. The apparatus of claim 1, wherein a crystal structure of the second silicon film is an amorphous, a polycrystal or a mixture of the amorphous and the polycrystal.

7. The apparatus of claim 1, wherein the first process gas supply system is configured to supply silane chloride as the first process gas, the second process gas supply system is configured to supply hydrogenated silane as the second process gas, and the third process gas supply system is configured to supply hydrogenated silane as the third process gas.

8. The apparatus of claim 1, further comprising:
a fourth process gas supply system configured to supply a dopant gas to the substrate existing within the process chamber,
wherein the control part is configured to control the third process gas supply system and the fourth process gas supply system so that the dopant gas is supplied together with the third process gas to the substrate during the process of supplying the third process gas.

9. The apparatus of claim 1, wherein the second process gas differs in molecular structure from the third process gas.

10. The apparatus of claim 1, wherein a pyrolysis temperature of the second process gas is lower than a pyrolysis temperature of the third process gas.

11. The apparatus of claim 1, wherein the second process gas is identical in molecular structure with the third process gas.

12. The apparatus of claim 1, wherein the control part is configured to control the heater so as to perform a process of thermally treating the first silicon film and the second silicon film after the first silicon film and the second silicon film are grown.

13. The apparatus of claim 12, wherein the control part is configured to control the heater such that a portion of the second silicon film which makes contact with the first silicon film is changed into a homo-epitaxial state when the process of thermally treating the first silicon film and the second silicon film is performed.

14. The apparatus of claim 12, wherein the control part is configured to control the heater such that a portion of the second silicon film which makes contact with the first silicon film is changed into a homo-epitaxial silicon film when the process of thermally treating the first silicon film and the second silicon film is performed.

15. The apparatus of claim 12, wherein the control part is configured to control the heater such that a region occupied by the first silicon film is expanded when the process of thermally treating the first silicon film and the second silicon film is performed.

16. The apparatus of claim 1, wherein the control part is configured to control the heater such that:
a temperature of the substrate is set at a first temperature during the processes of alternately performing supplying the first process gas and supplying the second process gas; and
a temperature of the substrate is set at a second temperature equal to or higher than the first temperature during the process of supplying the third process gas.

17. The apparatus of claim 16, wherein the control part is configured to control the heater so as to perform a process of thermally treating the first silicon film and the second silicon film after the first silicon film and the second silicon film are grown, and
a temperature of the substrate is set at a third temperature equal to or higher than the second temperature when the process of thermally treating the first silicon film and the second silicon film is performed.

18. An apparatus for manufacturing a semiconductor device, comprising:
a process chamber configured to accommodate a substrate therein;
a first process gas supply system configured to supply a first process gas containing silicon and a halogen element to the substrate existing within the process chamber;
a second process gas supply system configured to supply a second process gas containing silicon and not containing a halogen element to the substrate existing within the process chamber;
a third process gas supply system configured to supply a third process gas containing silicon to the substrate existing within the process chamber;
a heater configured to heat the substrate existing within the process chamber; and
a control part configured to control the first process gas supply system, the second process gas supply system, the third process gas supply system and the heater so as to perform processes of alternately performing supplying the first process gas to the substrate having a surface on which monocrystalline silicon and an insulation film are exposed and supplying the second process gas to the substrate, and supplying the third process gas to the substrate, whereby a first silicon film is homo-epitaxially grown on the monocrystalline silicon and a second silicon film differing in crystal structure from the first silicon film is grown on the insulation film.

19. The apparatus of claim 18, wherein the semiconductor device includes a three-dimensional flash memory or a dynamic random access memory.

20. A gas supply system comprising:
a first gas supply part configured to supply a first process gas containing silicon and a halogen element to a substrate;
a second gas supply part configured to supply a second process gas containing silicon and not containing a halogen element to the substrate; and
a third gas supply part configured to supply a third process gas containing silicon to the substrate,
wherein the first gas supply part, the second gas supply part and the third gas supply part are controlled so as to perform processes of alternately performing supplying the first process gas to the substrate having a surface on which monocrystalline silicon and an insulation film are exposed and supplying the second process gas to the substrate, and supplying the third process gas to the substrate, whereby a first silicon film is homo-epitaxially grown on the monocrystalline silicon and a second silicon film differing in crystal structure from the first silicon film is grown on the insulation film.

* * * * *